(12) United States Patent
Yukitomo et al.

(10) Patent No.: US 7,774,387 B2
(45) Date of Patent: Aug. 10, 2010

(54) DATA COMPRESSOR, DATA DECOMPRESSOR, AND DATA MANAGEMENT SYSTEM

(75) Inventors: Hideki Yukitomo, Yokohama (JP); Takehiro Nakayama, Yokohama (JP); Akira Kinno, Yokohama (JP); Atsushi Takeshita, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 517 days.

(21) Appl. No.: 10/935,584

(22) Filed: Sep. 8, 2004

(65) Prior Publication Data

US 2005/0102304 A1 May 12, 2005

(30) Foreign Application Priority Data

Sep. 19, 2003 (JP) ............................ P2003-328428

(51) Int. Cl.
*G06F 7/00* (2006.01)
(52) U.S. Cl. ...................... 707/809; 707/791; 707/803
(58) Field of Classification Search ................ 707/513; 715/513
See application file for complete search history.

(56) References Cited

U.S. PATENT DOCUMENTS

| 6,349,372 | B1 | 2/2002 | Benveniste et al. | |
| 6,941,511 | B1 * | 9/2005 | Hind et al. | 715/235 |
| 7,181,734 | B2 * | 2/2007 | Swamy et al. | 717/144 |
| 7,194,683 | B2 * | 3/2007 | Hind et al. | 715/235 |
| 2002/0073298 | A1 | 6/2002 | Geiger et al. | |

FOREIGN PATENT DOCUMENTS

| EP | 1 122 655 | * | 1/2001 |
| JP | 9-130616 | | 5/1997 |
| JP | 2001-251617 | | 9/2001 |
| JP | 2001-282516 | | 10/2001 |
| JP | 2002-163248 | | 6/2002 |
| JP | 2003-44459 | | 2/2003 |

(Continued)

OTHER PUBLICATIONS

Mathias Neumuller, et al., "Compact In-Memory Representation of XML", Design and Implemention of a compressed DOM for data-centric documents, Internal Report of University of strathclyde, 11 pages.

(Continued)

*Primary Examiner*—Tony Mahmoudi
*Assistant Examiner*—Paul Kim
(74) *Attorney, Agent, or Firm*—Oblon, Spivak, McClelland, Maier & Neustadt, L.L.P.

(57) ABSTRACT

A data compressor including a separating unit configured to separate input data into cross reference data with the reference information between the vertices, and a vertex group including the plurality of vertices with the types and values, and to output data of the vertex group thus separated; a template storing unit configured to store reference information between vertices having a specific pattern, as a template; a template match detecting unit configured to detect a portion matching the template stored in the template storing unit, from the cross reference data separated by the separating unit; and a template replacing unit configured to replace the matched portion detected by the template match detecting unit with the template, in a state in which the reference information between the vertices can be referred to, and to output the replaced cross reference data.

16 Claims, 23 Drawing Sheets

FOREIGN PATENT DOCUMENTS

JP 2004-32774 1/2004

OTHER PUBLICATIONS

Hartmut Liefke, et al., "XMill: An Efficient Compressor for XML Data", In proceedings of ACM SIGMOD International Conference on Management of Data, 2000, pp. 1-26.

Jacob Ziv, et al., "A Universal Algorithm for Sequential Data Compression", IEEE Transactions on Information Theory, vol. IT-23, No. 3, May 1977, pp. 337-343.

Mathias Neumüller, et al., "Improving XML Processing Using Adapted Data Structures", Web, Web-Services, and Database Systems. Node 2002 Web- and Database-Related Workshops, XP-002320150, Oct. 7, 2002, pp. 206-220.

Peter Buneman, et al., "Path Queries on Compressed XML", Proceedings of the 29th VLDB Conference, XP-002320151, Sep. 12, 2003, pp. 1-12.

* cited by examiner

*Fig.9*
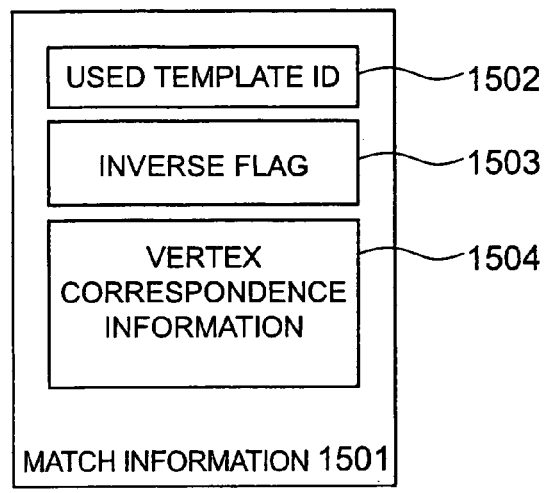
(a)
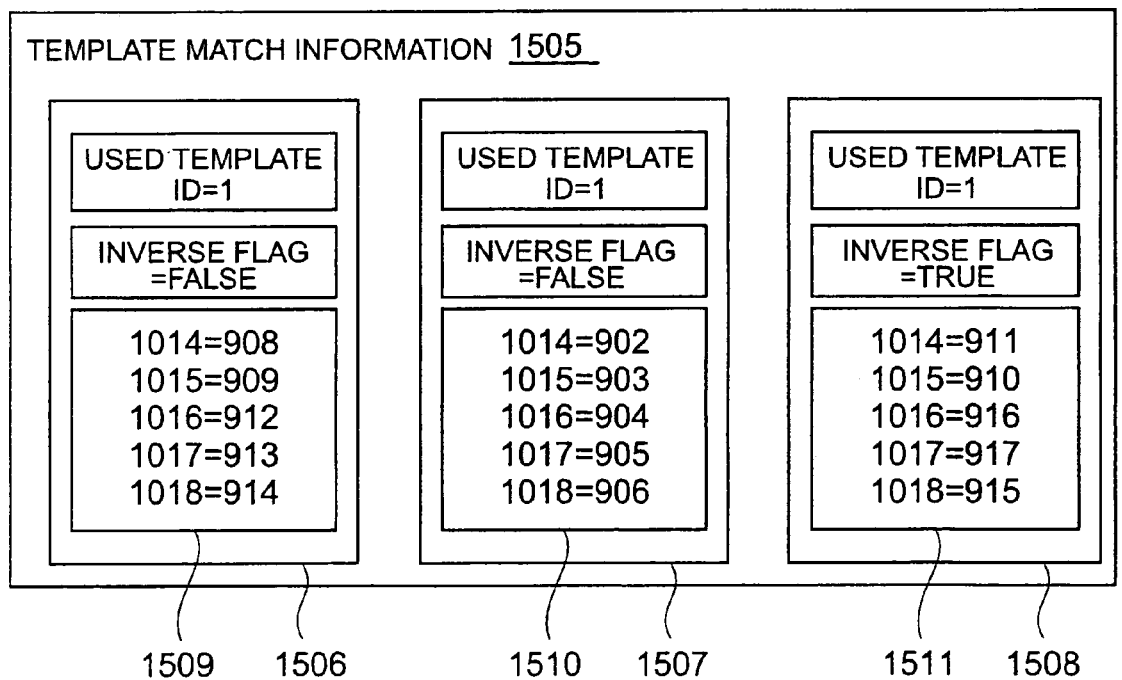
(b)

Fig.10

| | |
|---|---|
| S1 | SET i=0. |
| S2 | REPEAT THE FOLLOWING PROCESSING FOR EACH OF ALL MATCH PORTIONS INCLUDED IN TEMPLATE MATCH INFORMATION. DEFINE A SELECTED MATCH PORTION AS Mi. |
| S3 | CREATE ONE TEMPLATE ENTITY, AND DEFINE ENTITY ID=i FOR IT. DEFINE THE TEMPLATE ENTITY AS Oi, AND PERFORM THE FOLLOWING PROCESSING.<br><br>・COPY USED TEMPLATE ID AND INVERSE FLAG FROM USED TEMPLATE ID AND INVERSE FLAG OF Mi.<br><br>・COPY ENTITY INFORMATION FROM VERTEX CORRESPONDENCE INFORMATION OF Mi.<br><br>・SUBSTITUTE ORIGINAL REFERENCES AS THEY ARE, FROM CORRESPONDENCE RELATION DESCRIBED IN ENTITY INFORMATION, FOR ENTITY CONNECTION INFORMATION. |
| S4 | i=i+1 |
| S5 | SELECT CREATED TEMPLATE ENTITIES ONE BY ONE, AND REPEAT THE FOLLOWING PROCESSING. DEFINE A SELECTED TEMPLATE ENTITY AS Oi. |
| S6 | WHERE A VERTEX AS CONNECTION DESTINATION OF A REFERENCE DESCRIBED IN ENTITY CONNECTION INFORMATION IS INCLUDED IN ANOTHER TEMPLATE ENTITY, REPLACE IT WITH SET OF TEMPLATE ENTITY ID AND VERTEX OF TEMPLATE. |

Fig.13

S21 — DEFINE ALL TEMPLATE ENTITIES IN COMPRESSED CROSS REFERENCE DATA AS X1, X2,..., Xn, AND PERFORM THE FOLLOWING PROCESSING FOR ALL OF THEM.
DEFINE A SELECTED TEMPLATE ENTITY AS Xi.

S22 — COPY REFERENCE INFORMATION BETWEEN VERTICES IN TEMPLATE USED BY TEMPLATE ENTITY Xi, AND ASSIGN ID TO EACH VERTEX DESCRIBED IN ENTITY INFORMATION OF TEMPLATE ENTITY Xi.

S23 — WHERE A VERTEX DESCRIBED IN ENTITY CONNECTION INFORMATION OF TEMPLATE ENTITY Xi IS A VERTEX IN ANOTHER TEMPLATE ENTITY Xm, REPLACE IT WITH VERTEX ID DESCRIBED IN ENTITY INFORMATION OF Xm.

Fig.17
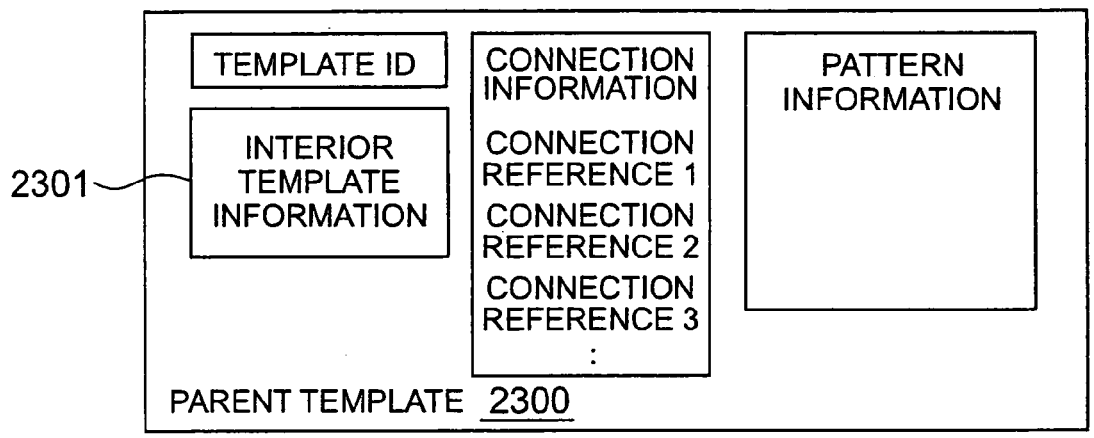
(a)
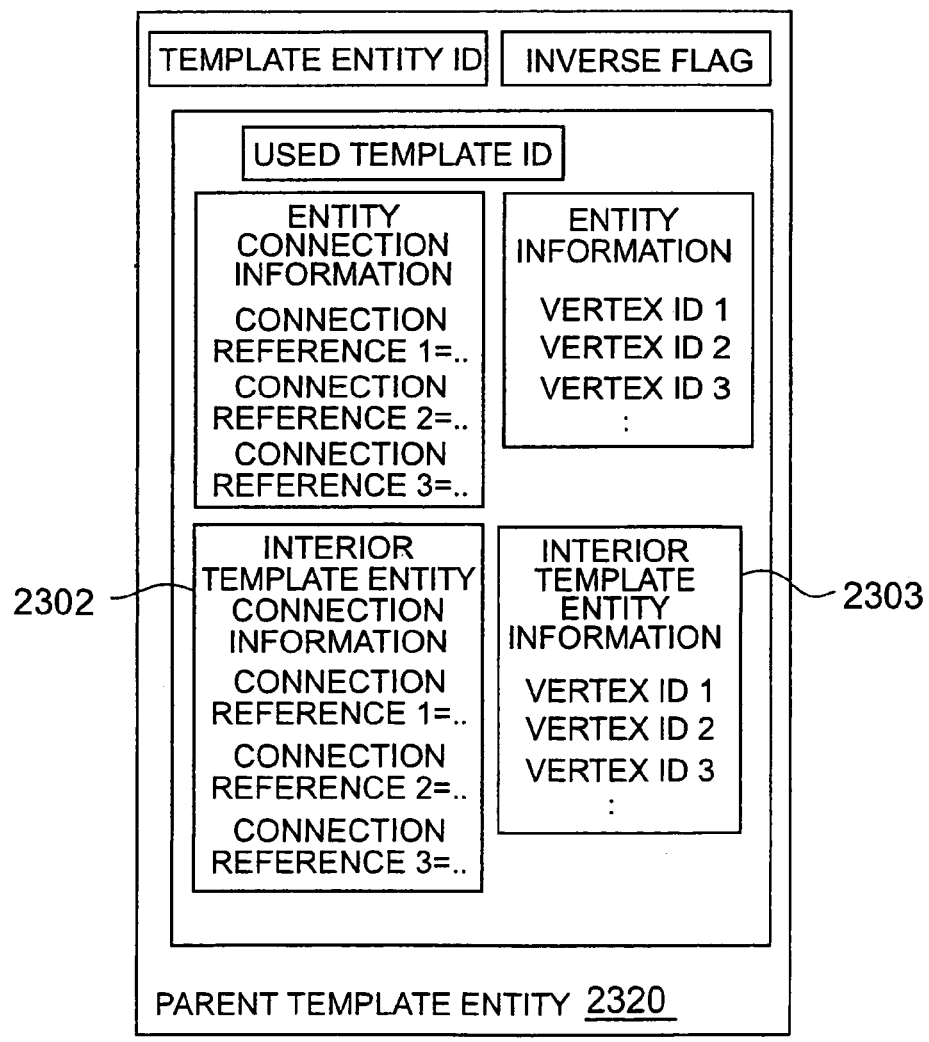
(b)

*Fig.18*

```
Ma ─── <book>
Ma ─── <title> FUNDAMENTALS </title> ─── Mb
            OF XML
Ma ─── <authors>
       ┌─ <author>YAMADA TARO</author> ─┐
Ma ────┼─ <author>SATO HANAKO</author> ─┼─ Mb
       └─ <author>TANAKA ICHIRO</author>─┘
       </authors> ─── Mb
Ma ─── <contents>
Ma ─┬─ <chapter> DTD</chapter> ─────────── Mb
    └─ <chapter> XML-Schema</chapter> ───┘
       </contents> ─── Mb
Mc ─── <misc/>
       </book> ─── Mb
```

XML DOCUMENT 10

DATA STRUCTURE 21
```

Fig.22

1: <book>
2: <title>
3: <authors>
4: <author>
5: <contents>
6: <chapter>
7: <misc>

ELEMENT NAME INFORMATION 13

Fig.23

```
FUNDAMENTALS
    OF XML

YAMADA TARO

SATO HANAKO

TANAKA ICHIRO

DTD

XML-Schema

TEXT INFORMATION 14
```

DATA COMPRESSOR, DATA DECOMPRESSOR, AND DATA MANAGEMENT SYSTEM

BACKGROUND OF THE INVENTION

1. Field of the Invention

The present invention relates to a compressor, a decompressor, and a data management system for electronic data.

2. Related Background Art

In recent years, the spread of WWW (World Wide Web) leads to increase in data exchange using structured documents, such as HTML (Hyper Text Markup Language) and XML (Extensible Markup Language). Particularly, XML is drawing attention as a next-generation language to supplement HTML and is expected to become most widespread in future in the field of information exchange in the Internet.

XML is a language with data representation to express a hierarchical structure of elements and a document by XML (XML document) is described, for example, as shown in FIG. 18. FIG. 18 is a diagram showing an XML document 10. As shown in FIG. 18, XML is generally classified into markup and text information. In the XML document 10 shown in FIG. 18, markups consist of element start marks (start tags) Ma, element end marks (end tags) Mb, and an empty element mark (empty element tag) Mc. In FIG. 18, <book>, <title>, <authors>, <author>, <contents>, and <chapter> indicate the element start marks Ma. In addition, </book>, </title>, </authors>, </author>, </contents>, and </chapter> indicate the element end marks Mb, and <misc/> indicates the empty element mark Mc. Each of regions from these element start marks Ma to the corresponding element end marks Mb, or the empty element mark Mc indicates an element (an information unit as a basis of XML).

Between an element start mark Ma and an element end mark Mb, another element mark and/or text information is allowed to be described. In the XML document 10 shown in FIG. 18, for example, information defined as text information includes a character string "Fundamentals of XML" in the element <title>, and a character string "YAMADA TARO" in the first element <author> appearing in the element <authors>.

Parent-child relations and sibling relations are defined among the elements and text information. In the case of the XML document 10 shown in FIG. 18, the element to start with the element start mark Ma <book> and end with the element end mark Mb </book> (i.e., the element <book>), contains the element to start with the element start mark Ma <title> and end with the element end mark Mb </title> (i.e., the element <title>). In this case, the element <book> is called a parent element for the element <title>, and the element <title> a child element for the element <book>. This is the parent-child relation between elements.

The element <title> and the element <authors> have the same parent element <book>, and are consecutive. In this situation, the element <title> and the element <authors> are called siblings; the element <title> is called a previous sibling for the element <authors>, and the element <authors> a next sibling for the element <title>. This is the sibling relation between elements.

In general, XML is expressed in the text format like the XML document 10 shown in FIG. 18, in communication between computers or in storage in hard disk apparatus or flash memories. On the other hand, in use for search and correction inside a computer, it is parsed to be transformed into a data structure suitable for the interior of the computer.

FIG. 19 is a diagram showing a data structure 11 obtained by parsing the XML document 10 shown in FIG. 18 to transform it into a format suitable for use inside the computer. In FIG. 19, the elements and text information are described as vertices 301 to 317 with their respective types and values. A type is described on the left side of each vertex 301-317: "E" indicates an element; "T" indicates text information. For example, the vertex 301 has the type 301a of "E". A value is described on the right side of each vertex: for example, the vertex 301 has the value 301b of "book". Where a vertex indicates an element, a name of the element (element name) is described in its value; where a vertex indicates a text information item, a character string is described in its value. For example, the vertex 302 indicates the element name <title>, and the vertex 306 indicates the text information "Fundamentals of XML".

Each vertex 301-317 has reference information chosen from among four references: parent reference, child reference, next sibling reference, and previous sibling reference, in order to express the parent-child relation and sibling relation of the original (non-transformed) XML document 10. In the case of the foregoing XML document 10, wherein the element <title> is the child element of the element <book> and the element <book> is the parent element of the element <title>, the data structure 11 shown in FIG. 19 is constructed as follows: for example, as to the vertices 301, 302, they have the child reference P1 from <book> to <title> and the parent reference P2 from <title> to <book> and those are expressed by arrows. The element <book> also has the element <authors> as a next child element to <title>. In this case, the vertices 302, 303 hold the next sibling reference P3 from the element <title> to the element <authors> and the previous sibling reference P4 from the element <authors> to the element <title>. It is defined that elements in sibling relations except for the head child element (e.g., the element <title>) have no direct parent reference.

In the data structure, the reference information between vertices can be managed separately from the element names and text information; for example, they can be expressed as shown in FIG. 20(a) and in FIG. 20(b), respectively. FIG. 20(a) is a diagram showing cross reference data 400 with the reference information between vertices, and FIG. 20(b) is a diagram showing a table 450 showing an assembly of vertices (also called a vertex group) with types and values set to either of the element and text information.

However, since there is a limit to the capacity of storage devices such as memories, it is required in storage of the data structure to efficiently compress the data structure to store the compressed data. In regard to this matter, Document "Mathias Neumuller and John N. Wilson: "Compact In-Memory Representation of XML" Internal Report of University of strathclyde" (hereinafter referred to as Document 1) discloses a method of compressing the element names and text information as shown in FIG. 20(b). Document 1 discloses the compression method of separately storing the element names and the text information at the respective vertices in the form of a dictionary, providing each vertex with an index of the dictionary, and avoiding redundant storage of an identical character string.

On the other hand, Document "Hartmut Liefke and Dan Suciu.: "XMill: An Efficient Compressor for XML Data", In proceedings of ACM SIGMOD International Conference on Management of Data, 2000" (hereinafter referred to as Document 2) discloses a method of compressing an XML document by reusing partial structures in the XML document. This method is to separate an original XML document into three, structure, element name information, and text information, and compress each of them by ordinary compression algorithms such as LZ77 (reference should be made as to the details of LZ77 to "Jacob Ziv, Abraham Lempel: A Universal Algorithm for Sequential Data Compression. IEEE. Transactions on Information Theory 23(3): 337-343 (1977)"). The compression method disclosed in Document 2 will be described below. In this compression method, first, each of element start marks and empty element marks is replaced with a short element name such as "#1", "#2", and so on and each element end mark with "/". The text information is replaced with "C". When the above compression method is applied to the separated XML document 10, the data structure 12, element name information 13, and text information 14 after the separation are expressed as shown in FIG. 21, in FIG. 22, and in FIG. 23, respectively.

In the compression method described in Document 2, they are compressed independently of each other by use of a compression algorithm represented by LZ77 or the like. The compression algorithm will be outlined below. The compression algorithm of LZ77 or the like is to discover partial patterns included in original input information and repetitively reuse they as templates, thereby effecting compression. For example, let us explain the compression of data structure 12 shown in FIG. 21. Templates X, Y, Z, W, and V are used as templates and the templates are assigned as follows: X="#1 #2C/#3"; Y="#4C/"; Z="/#5"; W="#6 C/"; V="/#7//". The data structure 12 shown in FIG. 21 can be expressed as "XYYYZWWV". This uses Y and W plural times as templates indicating partial document structures. If the templates can be repetitively used to express the original document by a small number of templates in this manner, the volume of information indicating the original XML document can be reduced, so as to enable the compression.

SUMMARY OF THE INVENTION

In the conventional technology as described above, however, the information items of the respective templates were independent of each other in the compression of the data structure of the XML document by use of the templates, and this raised the problem that increase in the number of templates increased the necessary storage amount by that degree, so as to place a heavy load on the storage device such as the memory.

The present invention has been accomplished in order to solve the above problem, and an object of the present invention is therefore to provide a data compressor, a data decompressor, and a data management system in a configuration capable of avoiding placing a heavy load on the storage device such as the memory necessary for storage of templates even with increase in the number of templates.

In order to solve the above problem, the present invention provides a data compressor comprising: separating means for separating input data having a plurality of vertices with their respective types and values, and reference information between the vertices, into cross reference data with the reference information between the vertices, and a vertex group consisting of the plurality of vertices with the types and values, and for outputting data of the vertex group thus separated; template storing means for storing reference information between vertices having a specific pattern, as a template, wherein the template can share the reference information between the vertices, with other stored templates; template match detecting means for detecting a portion matching the template stored in the template storing means, from the cross reference data separated by the separating means; and template replacing means for replacing the match portion detected by the template match detecting means, in the cross reference data separated by the separating means, with the temperate, in a state in which the reference information between the vertices can be referred to, and for outputting the replaced cross reference data. Since in this data compressor the template stored in the template storing means has the configuration wherein the template can share the reference information between the vertices, with other stored templates, it can reduce the storage space for storing templates.

The present invention also provides a data compressor comprising: separating means for separating input data having a plurality of vertices with their respective values, each value being capable of having a type as attribute information, and reference information between the vertices, into cross reference data with the reference information between the vertices, and a vertex group consisting of the plurality of vertices with the values, and for outputting data of the vertex group thus separated; template storing means for storing reference information between vertices having a specific pattern, as a template, wherein the template can share the reference information between the vertices, with other stored templates; template match detecting means for detecting a portion matching the template stored in the template storing means, from the cross reference data separated by the separating means; and template replacing means for replacing the match portion detected by the template match detecting means, in the cross reference data separated by the separating means, with the temperate, in a state in which the reference information between the vertices can be referred to, and for outputting the replaced cross reference data. Since this data compressor is also configured so that the template stored in the template storing means has the configuration wherein the template can share the reference information between the vertices, with other stored templates, it can reduce the storage space for storing templates.

Each of the above data compressors is preferably configured so that the template is a template in which reference directions can be inverted in part or all of the reference information between the vertices. With such a template, one template can be applied as inverted, and it can reduce the number of templates.

The data compressor may also be configured so that the template storing means stores a template for consecutive sibling references, the template has connection information for application to the cross reference data having a consecutive sibling reference portion which has N vertices from the first to the Nth, in which the vertices with sequence numbers except for the first vertex and the second vertex refer to each other, in which the first vertex refers to the second vertex and holds a reference to the outside, in which the Nth vertex refers to the (N−1)th vertex, and in which each vertex from the second to the Nth holds no reference to the outside or all hold the same number of references. This template does not have to contain the reference information between the vertices, and thus contributes to reduction of storage quantity.

Each of the above data compressors may be configured so that the template storing means stores a parent template in which the aforementioned template can be applied to the reference information between the vertices. With this template, a definition of another template can be used for definition of the template, and this can reduce the storage quantity necessary for expression of the template.

Furthermore, preferably, the template storing means stores a common template that can be used in common to a plurality of input data. Since the common template is used in common to a plurality of input data, it can reduce the number of templates.

The present invention further provides a data decompressor comprising: template storing means for storing reference information between a plurality of vertices having a specific pattern, as a template, wherein the template can share the reference information between the vertices, with other stored templates; extracting means for importing cross reference data replaced with the template and compressed, as first input data, and for restoring original uncompressed cross reference data, from the cross reference data by use of the template; and combining means for importing data of a vertex group consisting of the plurality of vertices with their respective types and values, as second input data, and for outputting data obtained by combining the data of the vertex group with the cross reference data restored by the extracting means. This data decompressor is able to restore the original uncompressed cross reference data by using the template stored in the template storing means, from the compressed cross reference data.

The present invention further provides a data management system comprising: first data storing means for storing compressible data; second data storing means for storing data compressed by the data compressor; use frequency observing means for observing a frequency of use of each data stored in the first data storing means and in the second data storing means and for outputting a movement request according to the frequency of use observed; controlling means for, in accordance with the movement request from the use frequency observing means, performing such a control for movement of data that high-frequency data with the frequency of use being high is decompressed by the data decompressor to be stored into the first data storing means and that data with the frequency of use being lower than that of the high-frequency data is compressed by the data compressor to be stored into the second data storing means; and selecting means for acquiring data according to an instruction from the controlling means from either of the first data storing means and the second data storing means and for outputting the acquired data. This data management system is able to move data between the first data storing means and the second data storing means in accordance with its frequency of use, and thus to store data by properly switching into a compressed or uncompressed state. Therefore, frequently used data is not compressed, and its access speed is kept as it is, and this can achieve high speed data access on an average.

According to the present invention, it is feasible to avoid placing a heavy load on the storage device such as the memory necessary for storage of templates even with increase in the number of templates used for compression of data structure.

BRIEF DESCRIPTION OF THE DRAWINGS

FIG. 9 is a diagram showing template match information 1501 and 1505.

FIG. 10 is a diagram showing an example of a replacement procedure.

FIG. 13 is a diagram showing an example of a procedure for restoring original reference information between vertices from a template.

FIG. 17 is a diagram showing a parent template and a parent template entity.

FIG. 18 is a diagram showing another example of the XML document.

FIG. 21 is a diagram showing a data structure separated from the XML document of FIG. 18.

FIG. 22 is a diagram showing element name information separated from the XML document of FIG. 18.

FIG. 23 is a diagram showing text information separated from the XML document of FIG. 18.

DESCRIPTION OF THE PREFERRED EMBODIMENTS

Embodiments of the data compressor, data decompressor, and data management system according to the present invention will be described below in detail with reference to the accompanying drawings.

Embodiments of Data Compressor

First Embodiment

Figure 1:
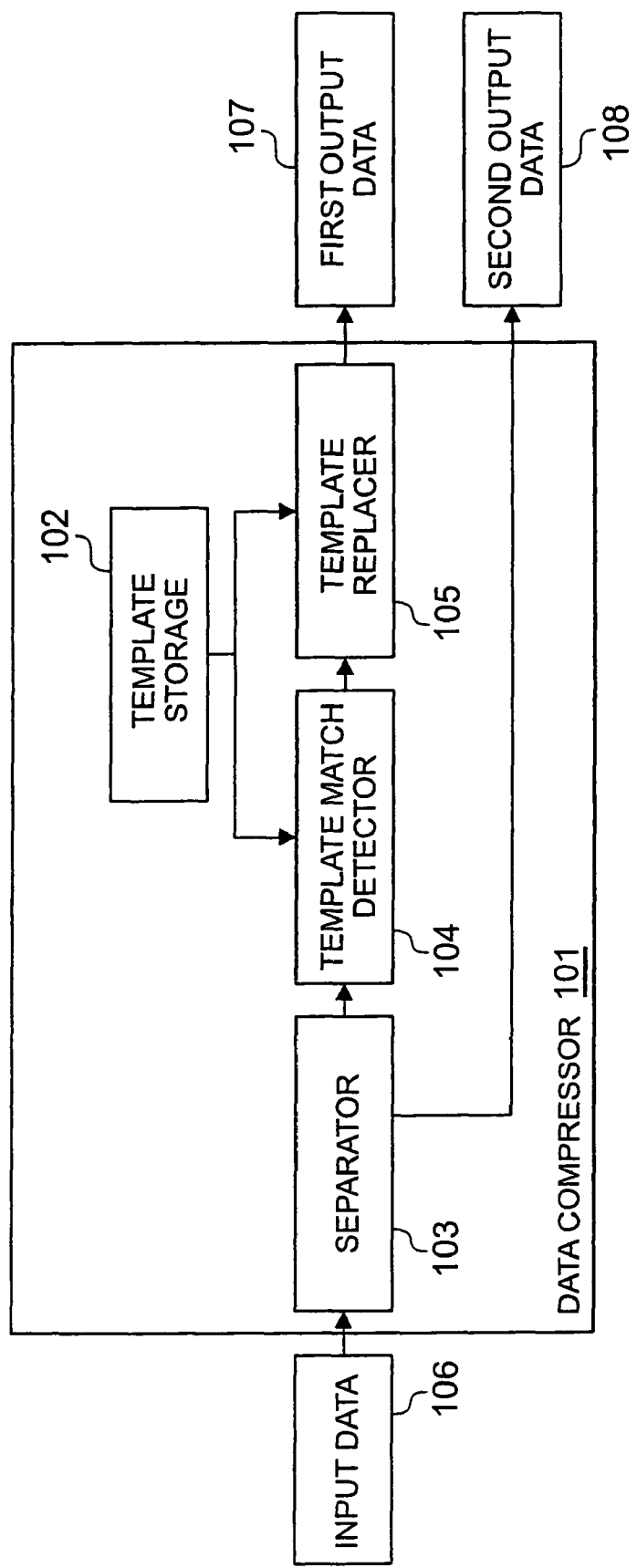
FIG. 1 is a block diagram showing a configuration of a data compressor according to an embodiment of the present invention.

FIG. 1 is a block diagram showing a configuration of data compressor 101 according to the present embodiment. As shown in FIG. 1, the data compressor 101 has a template storage 102, a separator 103, a template match detector 104, and a template replacer 105. This data compressor 101 is configured to output first output data 107 and second output data 108 from input data 106.

The data compressor 101 in FIG. 1 is constructed as a single device incorporating the template storage 102, separator 103, template match detector 104, and template replacer 105, but it does not always have to be implemented as a single device and may also be implemented by connecting such devices through unrepresented communication means. For example, it is also possible to adopt a configuration wherein the template storage 102 is removed from the data compressor 101 and is implemented as a separate device and wherein the data compressor 101 is connected through a communication means to the template storage 102. This configuration makes it feasible to provide a plurality of data compressors without template storage 102 and to share one template storage 102 among them.

Figure 2:
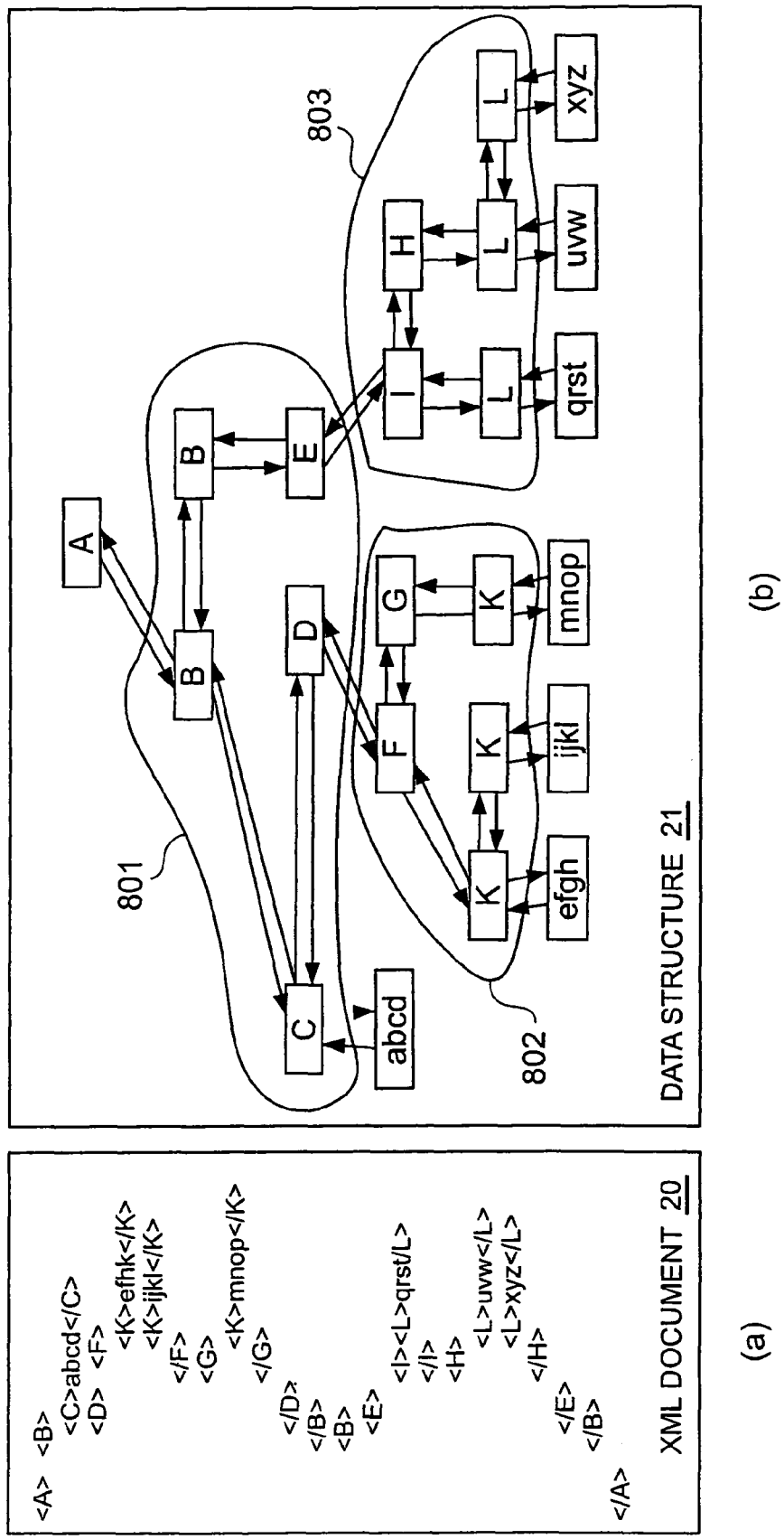
FIG. 2 is a diagram showing an example of an XML document and a data structure of the XML document.

In the present embodiment the invention will be detailed according to a procedure of compressing an XML document 20 shown in FIG. 2, but objects of compression by the data compressor 101 in the present embodiment are not limited to XML documents like the XML document 20. The invention can also be applied to data expressed by general graph structures like those having vertices with types and values, or vertices with values, each value having a type as attribute information, and reference information between the vertices. The vertices with values, each value having a type as attribute information, are, for example, a vertex with a value of "1" and information "integer" as attribute information, and thus the type of the value can be determined based on the attribute information. Therefore, the vertices with values, each value having a type as attribute information, can also be compressed by the data compressor 101 in the present embodiment, in the same manner as the data having the vertices with their respective types and values. The data expressed by general graph structures is not limited to rooted, ordered trees like the XML documents, but refer to more general undirected or directed graphs with a closed path, for example.

FIG. 2(a) is a diagram showing an example of text representation of an XML document 20. The XML document 20 can be converted into a data structure 21 suitable for the interior of the computer as shown in FIG. 2(b), by a well-known technique (e.g., Xerces presented in http://xml.apache.org/xerces2-j/). A compression step after the conversion of the XML document 20 into the data structure 21 shown in FIG. 2(b) will be described below. This data structure 21 has a plurality of vertices with their respective types and values, and reference information between the vertices.

On the other hand, the separator 103 shown in FIG. 1 imports the data structure 21 shown in FIG. 2(b), as input data 106 and separates the input data 106 into cross reference data having the reference information between the vertices, and a vertex group consisting of the plurality of vertices with their respective types and values. Namely, the separator 103 generates cross reference data 900 by sequentially assigning vertices 901 to 923 respective IDs (vertex IDs) capable of uniquely identifying the respective vertices, and a table 950 by listing the vertex IDs thus assigned and sets of types and values originally held by the corresponding vertices 901-923, and the table 950 is constructed of an assembly of vertices 901-923 (vertex group) with types and values, thereby separating the data structure 21. The assignment of vertex IDs to the respective vertices 901 to 923 can be accomplished by the breadth-first search, depth-first search, or the like, and the breadth-first search is adopted herein. The separator 103 outputs the data of the vertex group obtained by the separation, as second output data 108.

The cross reference data 900 and the table 950 separated from the XML document 20 are as shown in FIG. 3(a) and in FIG. 3(b), respectively. Here FIG. 3(b) is expressed in a format in which a vertex ID 950a, a type 950b, and a value 950c form a row. The template storage 102 preliminarily stores a template and a template entity, prior to the compression. The template storage 102 stores a template and a template entity with a high frequency which are preliminarily known as those applied at a high frequency, for example. Examples of such template and template entity are a template 1003 and a template entity 1020 shown in FIG. 4(a) and in FIG. 4(b), respectively.

The template 1003 has a template ID 1001, connection information 1002, and pattern information 1004. The template ID 1001 is used for uniquely identifying each template, in a case where the template storage 102 stores a plurality of templates. The pattern information 1004 represents a pattern of reference information between vertices expressed by the template, and has a plurality of vertices and cross reference information between them. The reference information in the pattern information 1004 involves four references: parent reference, child reference, next sibling reference, and previous sibling reference. Among references without a vertex of a connection destination, a reference not used in compression of the cross reference data 900, as described later, with application of the template, is provided with a description of the fact in the pattern information 1004. This can be implemented, for example, by defining an invalid vertex and making a reference to the vertex. The connection information 1002 includes a list of connection references indicating connections with another template or vertex in compression of the cross reference data 900 with application of the template 1003.

Since the template 1003 is configured with a distinction between the connection information 1002 with the connection references and the pattern information 1004 with the reference information, it is possible to share the pattern information 1004 among different templates 1003. Namely, the connection information 1002 is made different from another to make a difference in vertices and other template that can be connected, whereby templates with the same pattern information 1004 can be used like different templates. Then it becomes feasible to omit the reference information between vertices in the template and thus to efficiently utilize the memory use amount (storage area) of the template storage 102.

FIG. 4(c) is a diagram showing a first template 1011 as a specific example of the template 1003. "1" is set in the template ID 1012 in the first template 1011 shown in FIG. 4(c). The pattern information 1019 in the first template 1011 is comprised of five vertices 1014 to 1018 and references between them, and the references are described by arrows. Kinds of the references are indicated by describing p for parent reference, c for child reference, ns for next sibling reference, and ps for previous sibling reference at the arrows. For example, a child reference c of a vertex 1014 designates a vertex 1016, and a next sibling reference of the vertex 1016 designates a vertex 1017.

In addition, "x" describes an end point of a reference indicating that it is not used in the compression of cross reference data 900 with application of the template, and "o" describes an end point of a reference indicating that it is connected to another template or vertex in the compression of cross reference data 900 with application of the template. For the four references corresponding to the latter, i.e., for the parent reference of the vertex 1014 and the child references of the vertex 1016, the vertex 1017 and the vertex 1018, their vertex IDs and types of references are listed in the connection information 1013.

The template entity 1020 is used for indicating the application of the template (or indicating that the template has been applied) to the input data 106 in the compression of cross reference data 900. This template entity 1020 has a template entity ID 1005, an inverse flag 1006, and template-specific information 1007. The template-specific information 1007 has a used template ID 1008 indicating a template applied, entity connection information 1009, and entity information 1010. By referring to the template entity 1020 in the cross reference data after compressed, it becomes feasible to grasp the application contents of the template.

The template entity ID 1005 is used for, in the compression of the cross reference data 900 with application of a template, uniquely specifying an application portion of the template. The inverse flag 1006 indicates whether directions of sibling relations are used in an inverted state in the compression of the cross reference data 900 with application of the template. In the present embodiment, when the inverse flag 1006 is "false", the next sibling references and previous sibling references have their literal meanings, and when the inverse flag 1006 is "true", each next sibling reference means a previous sibling reference, and each previous sibling reference means a next sibling reference.

The entity information 1010 in the template-specific information 1007 is provided for listing vertices to be connected in the compression of cross reference data 900 with application of the template. This entity information 1010 stores IDs of the vertices encompassed in the template in the compression of cross reference data 900 with application of the template. The entity connection information 1009 will be described later. The inverse flag 1006 is needed in utilization with inversion of the same template, but is not needed in cases without such application of the template.

Next, the template match detector 104 detects a portion matching the template stored in the template storage 102, from the cross reference data 900 separated from the input data 106 by the separator 103. Since it is expected that the template storage 102 stores a plurality of templates, it is conceivable that there are a plurality of detection results obtained by the template match detector 104. However, the detection results are uniquely defined, for example, by the match detection procedure shown in FIG. 8 as described later.

Figure 8:
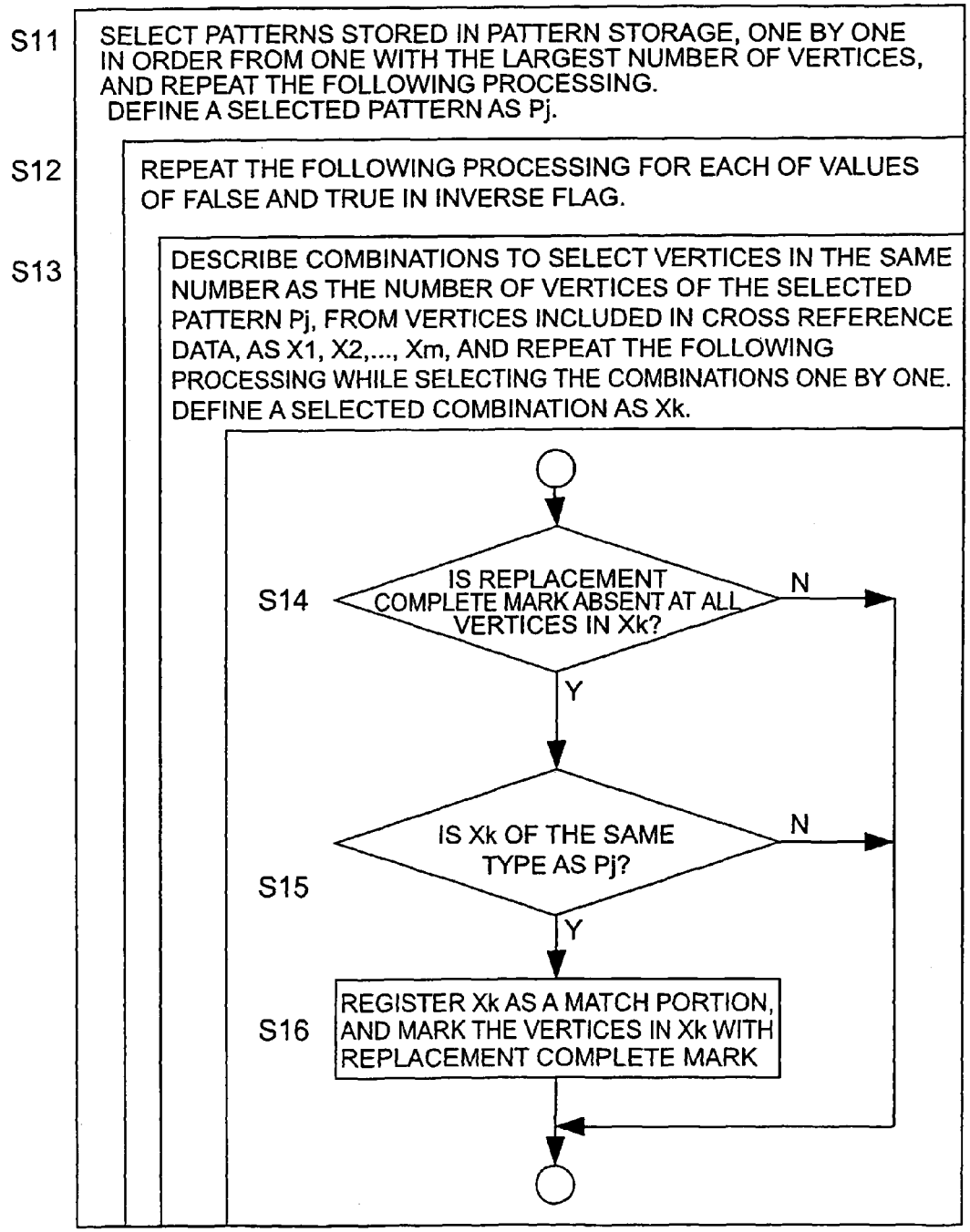
FIG. 8 is a diagram showing an example of a match detection procedure.

The present embodiment shows match portions obtained from the cross reference data 900 by the procedure shown in FIG. 8, in the case where the template storage 102 stores the first template 1011 only. A match portion 1501 with the template can be expressed, for example as shown in FIG. 9(a), by a used template ID 1502, an inverse flag 1503, and vertex correspondence information 1504 indicating correspondence between the vertices of the template and the vertices of original cross reference data 900.

Template match information 1505, which indicates the result of the match detection with the template stored in the template storage 102, from the cross reference data 900 by the template match detector 104, is as shown in FIG. 9(b). This template match information 1505 is the result of the detection by the procedure shown in FIG. 8, in the case where the template storage 102 stores the first template 1011 only. The template match information 1505 herein has first, second, and third match portions 1506, 1507, and 1508, indicating three portions of matches.

The first match portion 1506 and the second match portion 1507 indicate that matching is made by using the first template 1011 without inversion and making correspondence between the vertices of the template and the vertices of the original cross reference data 900 as indicated in the vertex correspondence information 1509 and in the vertex correspondence information 1510, respectively. The third match portion 1508 indicates that matching is made by inverting the first template 1011 and making correspondence between the vertices of the template and the vertices of the original cross reference data 900 as indicated in the vertex correspondence information 1511. Then the template match detector 104 transmits (or feeds) the template match information 1505 of this configuration to the template replacer 105.

The template replacer 105 imports the template match information 1505 from the template match detector 104, applies the template to the original cross reference data 900 by use of the template match information 1505 to effect replacement in a state in which the reference information between the vertices can be referred to, by use of the template entity 1020, and outputs the result of the replacement as first output data 107. The replacement procedure of replacing the original cross reference data 900 by use of the template is as shown in FIG. 10 and the replacement turns out to be cross reference data 1100 shown in FIG. 5. This cross reference data 1100 is cross reference data after compression (hereinafter also referred to as "compressed reference data").

FIG. 10 is a diagram showing the replacement procedure. The replacement procedure is carried out as follows: after a start of processing, the flow goes to step 1 to set 0 in i; then the flow goes to step 2 to repeat processes at and after step 3 for each of all match portions (in the aforementioned case, the first, second, and third match portions 1506, 1507, and 1508) included in the template match information (template match information 1505). A match portion selected is represented by Mi. At step 3, a template entity is created and an entity ID thereof is set as entity ID=i. This template entity is denoted by Oi and the following processes are carried out. The used template ID and inverse flag for the template entity are copied from the used template ID and inverse flag of Mi, respectively. The entity information is copied from the vertex correspondence information of Mi. The entity connection information is generated by substituting the original references as they are, from the correspondence relation described in the entity information. Then the flow goes to step 4 to calculate i=i+1. At subsequent step 5, the template entities thus created are selected one by one, and the following process is repeated for each. A template entity selected is represented by Oi. Next, the flow moves to step 6 and, where a connection destination vertex of a reference described in the entity connection information is included in another template entity, it is replaced with a set of a template entity ID and a vertex of the template.

Figure 4:
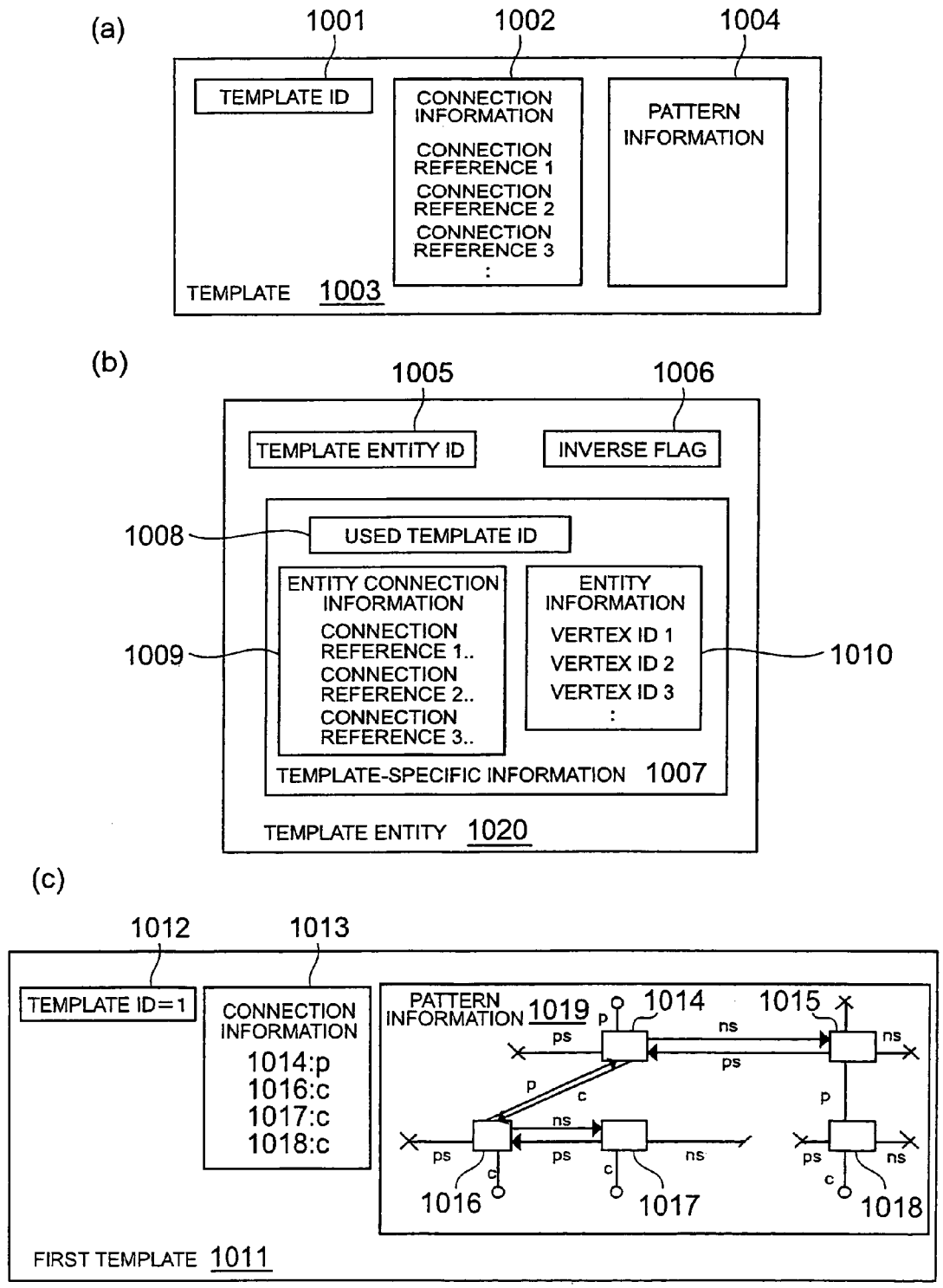
FIG. 4 is a diagram showing a configuration of a template, a configuration of a template entity, and a configuration of a first template.
Figure 5:
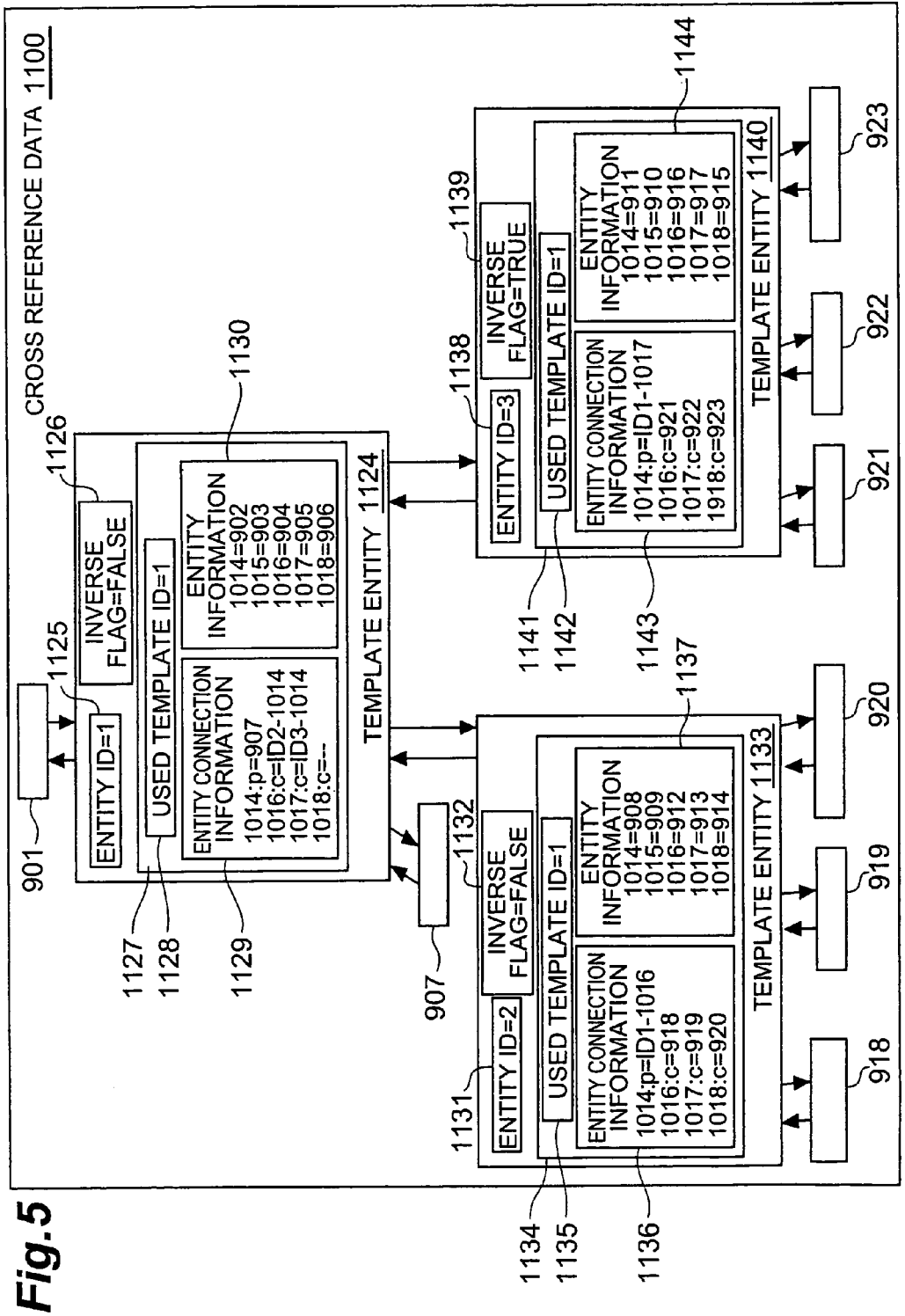
FIG. 5 is a diagram showing compressed cross reference data.

In FIG. 5, there exist three template entities: template entity 1124, template entity 1133, and template entity 1140. The template entity 1124, template entity 1133, and template entity 1140 have their respective entity ID 1125, entity ID 1131, and entity ID 1138, and they are assigned values of "1", "2", and "3", respectively, so as to be identifiable. The template entities all have "1" set in their used template IDs 1128, 1135, and 1142, and the inverse flags 1126, 1132, and 1139 with the value of false for the first two and with the value of true for the last. This indicates that the first template 1011 shown in FIG. 4(c) was applied without inversion to the template entities 1124, 1133 and that the first template 1011 was applied with inversion to the template entity 1140.

The entity information of each template entity 1124, 1133, 1140 in FIG. 5 contains information indicating the correspondence between the vertices embraced in the template and the vertices of the cross reference data before the application of the template. For this reason, the reference information between the vertices remains in the replaced cross reference data 1100, and it can be referred to. For example, in the case of the template entity 1124, the entity information 1130 contains the information indicating that the vertices 1014, 1015, 1016, 1017, and 1018 of the first template 1011 correspond to the vertices 902, 903, 904, 905, and 906, respectively, of the cross reference data 900 before the compression, which is shown in FIG. 3(a). The entity connection information of each template entity contains information indicating connection relations with another template entity or vertex. The template applied to each of the template entities is the first template 1011, and the connection information 1013 thereof describes that the first template 1011 holds four references that can be connected to the outside.

Thus, the entity connection information of each template entity describes which vertices correspond to these reference destinations. For example, in the case of the template entity 1124, the entity connection information 1129 contains information indicating that the parent reference of vertex 1014 is connected to the vertex 907, the child references of vertex 1016 and vertex 1017 are connected to a vertex 1014 of another entity with a template entity ID of "2" and to a vertex 1014 of another entity with a template entity ID of "3", respectively, and the child reference of vertex 1018 is not connected to any vertex.

Figure 3:
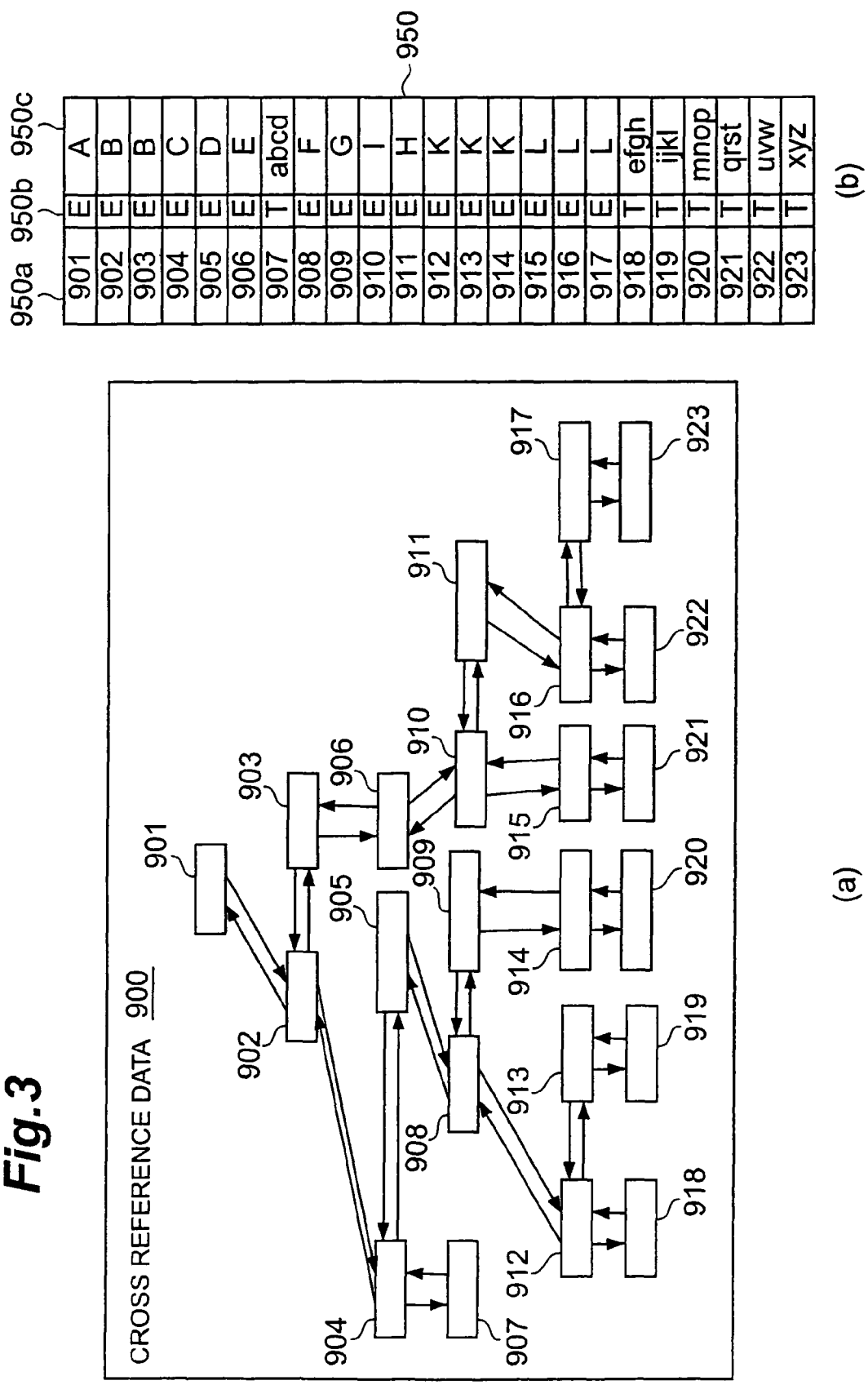
FIG. 3 is a diagram showing cross reference data and a table of an assembly of vertices separated from the XML document of FIG. 2.

In the cross reference data 900 before the application of the template, as shown in FIG. 3, each of the vertices 902 to 917 had four references, whereas in the cross reference data 1100 after the application of the template shown in FIG. 5, they are replaced with the template entities without the reference information between vertices. This replacement enables compression with the template. The applied template is also different as described below from those in the conventional technology. Namely, the template match portion 1508 did not match the first template 1011 and thus the conventional technology required another template for the template match portion 1508; whereas in the present embodiment, as described above, the template match portion 1508 can match the inverse of the first template 1011 and thus no additional template is necessary for the template match portion 1508. For this reason, it becomes feasible to efficiently utilize the storage area of the template storage 102.

The present embodiment cites nothing about the compression of the second output data 108 which is the assembly of vertices with types and values separated from the input data shown in FIG. 3(b), except that it is outputted after separated by the separator 103. The second output data 108 can be compressed, for example, by a combination with the aforementioned method described in Document 1 or the like. In the present embodiment one inverse flag is prepared for each template entity, but it is also possible to prepare one inverse flag for the entire cross reference data or to set the both.

On the other hand, where the data compressor 101 in the present embodiment described above is applied to plural types of input data, the template can be used as a common template shared among the plural types of input data. Since the common template can be applied to the plural types of input data, there is no need for providing templates corresponding to the respective input data. Therefore, it is feasible to efficiently use the memory of the template storage 102.

Figure 11:
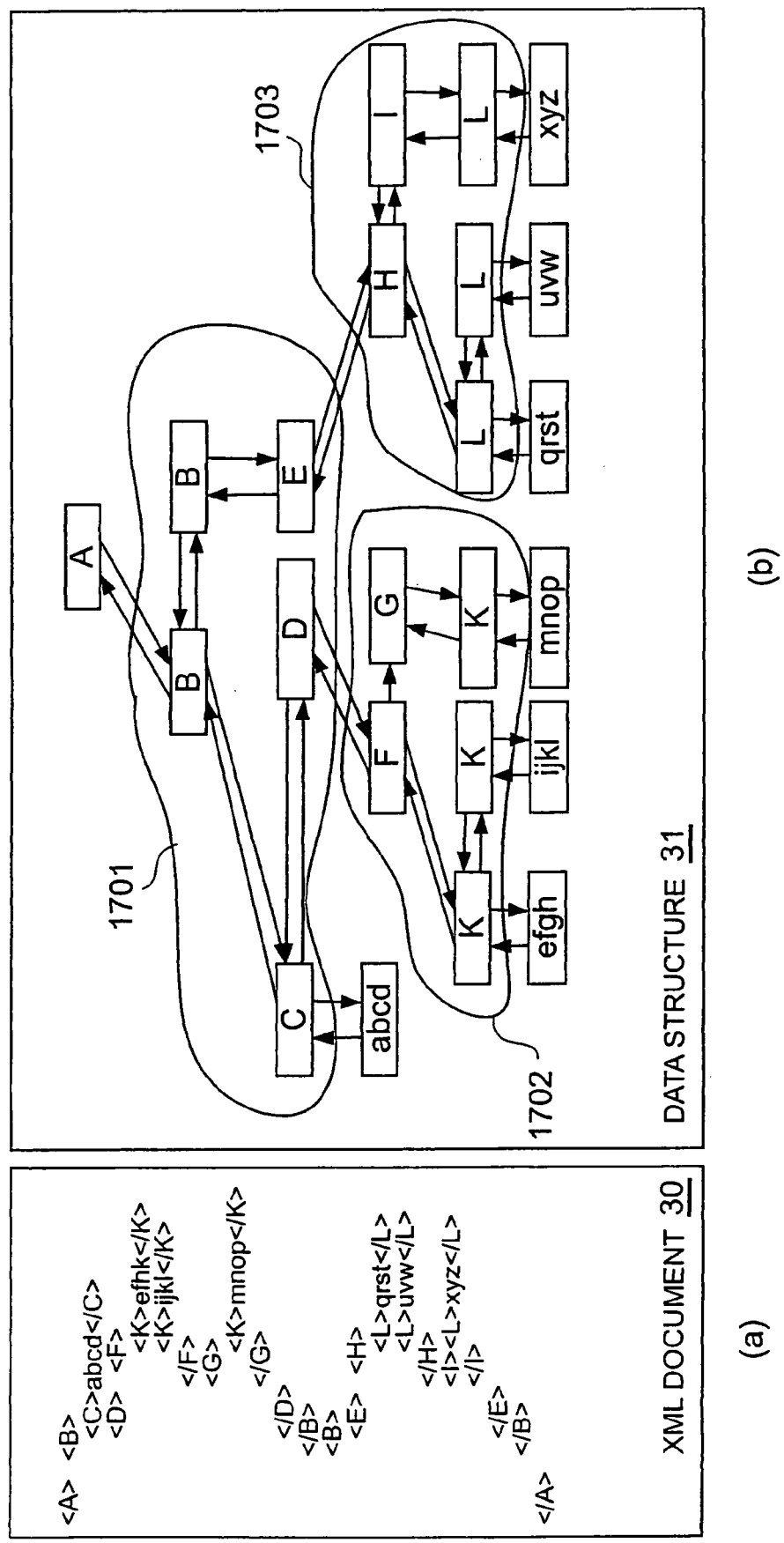
FIG. 11 is a diagram showing another XML document and a data structure of the XML document.

For example, in the case of an XML document 30 shown in FIG. 11(a), the first template 1011 shown in FIG. 4(c) can also be applied thereto in the same manner as in the case of the XML document 20 shown in FIG. 2, by the match detection procedure shown in FIG. 8. Then the template storage 102 stores the template applied to the both XML documents 20, 30 as the same common template without a distinction, whereby it is feasible to efficiently use the memory in the template storage 102 (or to increase the efficiency of utilization of the memory).

The match detection procedure shown in FIG. 8 is as follows. At step 11 after a start of processing, a pattern is selected from those stored in the pattern storage in order from one with the largest number of vertices, and the following processing is repeated for each pattern. The selected pattern is denoted by Pj. Then the flow goes to step 12 to repeat the following processing for each of false and true as a value of the inverse flag. At subsequent step 13, combinations to select vertices in the number matching the number of vertices in the selected pattern Pj, from the vertices included in the cross reference data are defined as X1, X2, . . . , Xm, and the following processing is repeated while selecting one by one from them. A selected combination is denoted by Xk. Then the flow goes to step 14 to determine whether neither vertex included in Xk is accompanied by a replacement complete mark. With no mark, the flow goes to step 15; otherwise the processing is terminated. When the flow moves to step 15, it is determined whether Xk is of the same type as Pj. If they are of the same type, the flow goes to step 16; otherwise the processing is terminated. When the flow goes to step 16, Xk is registered as a match portion, and the vertices included in Xk are provided with a mark indicating the completion of replacement.

Second Embodiment

Figure 6:
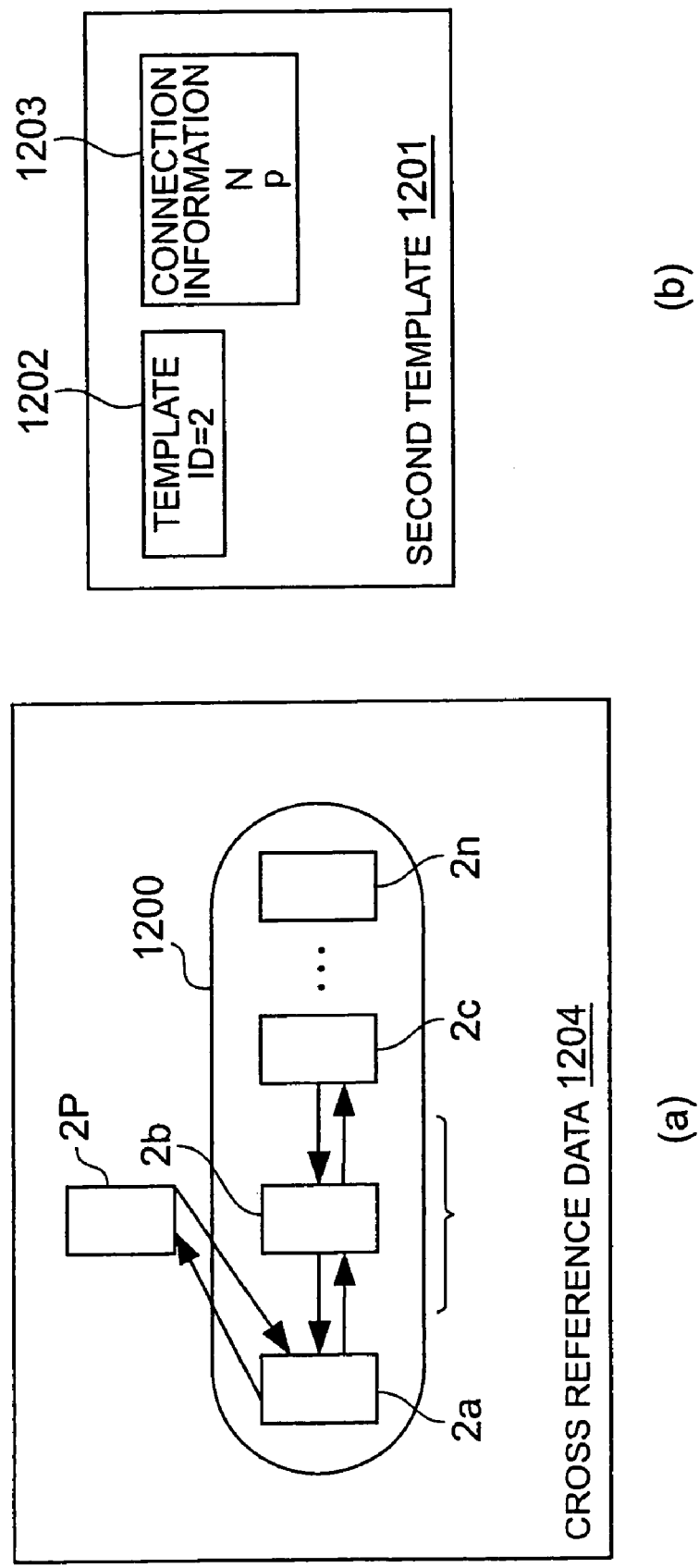
FIG. 6 is a block diagram showing another cross reference data and a configuration of a second template.

Let us explain a case where cross reference data 1204 with a plurality of consecutive sibling references as shown in FIG. 6(a) is compressed. The data compressor 101 is configured to compress this cross reference data 1204 by replacing a consecutive sibling reference part 1200 shown in FIG. 6(a) with a second template 1201 shown in FIG. 6(b). The second template 1201 shown in FIG. 6(b) has a template ID 1202 and connection information 1203, but has no pattern information, different from the first template 1101. This second template 1201 is a template for consecutive sibling references which is provided for compressing the cross reference data with the consecutive sibling reference part like the cross reference data 1204.

In the cross reference data 1204 herein, as shown in FIG. 6(a), the consecutive sibling reference part 1200 is configured as follows: it has N vertices 2a, 2b, 2c, . . . , 2n from the first, the second, the third, . . . to the Nth, the vertices with sequence numbers other than the first vertex 2a and the second vertex 2b necessarily refer to each other, and the first vertex 2a refers to the second vertex 2b and holds a reference to a vertex 2p outside the consecutive sibling reference part 1200. In addition, the Nth vertex 2n refers to the (N−1)th vertex not shown, and each vertex from the second to the Nth holds no reference to the outside of the consecutive sibling reference part 1200 (or they may hold the same number of references, for example, like the vertices 912, 913 in FIG. 3). At least what we should know in order to compress such cross reference data 1204 is the number of vertices constituting the consecutive sibling reference part 1200 and the reference of the first vertex to the outside. Therefore, the connection information 1203 in the second template 1201 is configured to contain the number N of vertices constituting the consecutive sibling reference part, and the parent reference p of the template. The template ID 1202 is "12".

Figure 7:
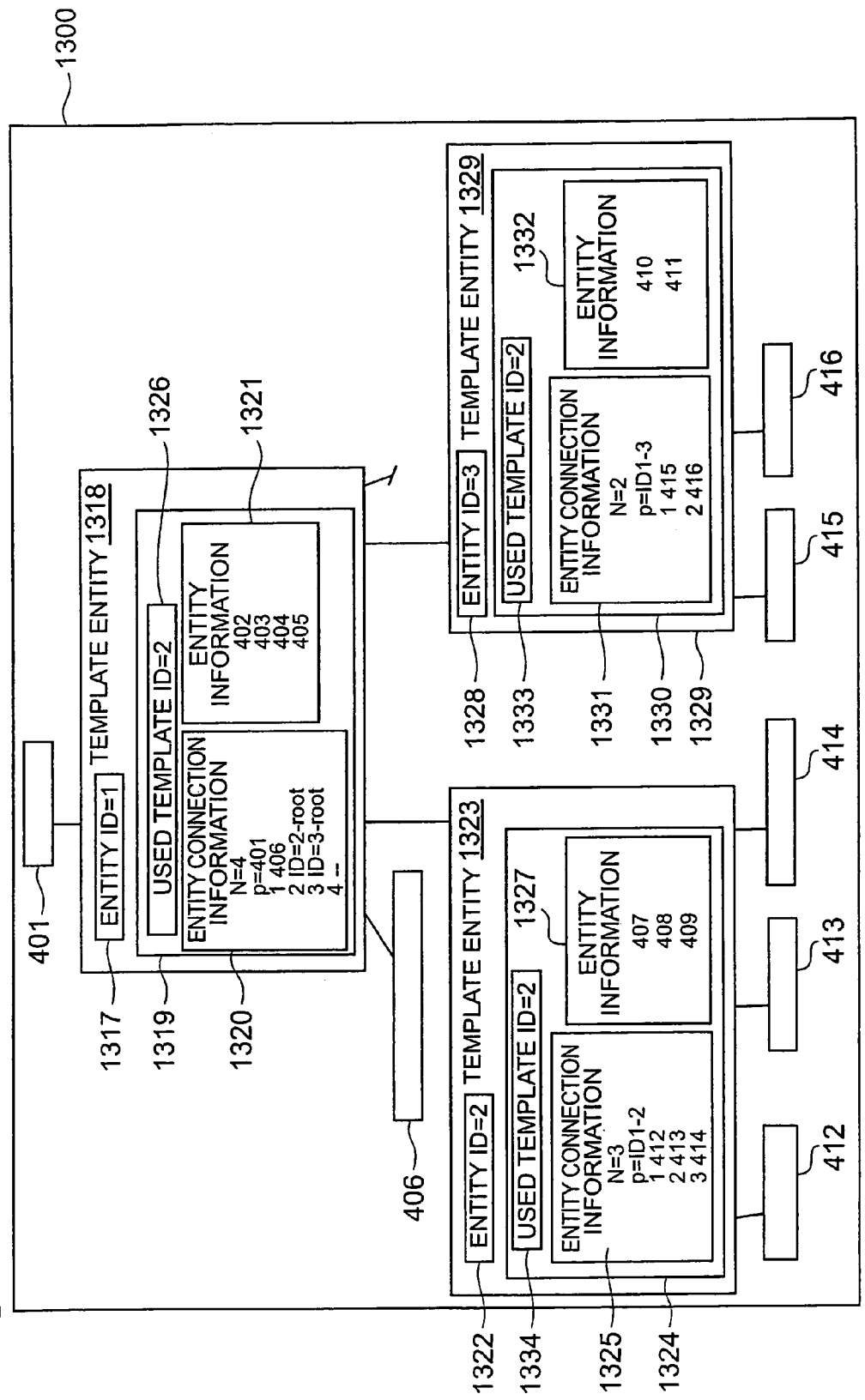
FIG. 7 is a diagram showing compressed cross reference data in FIG. 6.

FIG. 7 is a diagram showing cross reference data 1300 after the compression of the cross reference data 1204 by use of the second template 1201 shown in FIG. 6(b). In the compression in this case, the detection of match portions with the template and the application of the template can be implemented in the same manner as in the first embodiment. In FIG. 7, the cross reference data 1300 contains three template entities: template entities 1318, 1323, and 1329, and their entity ID 1317, entity ID 1322, and entity ID 1328 hold values of "1", "2", and "3", respectively. The template entities all have their respective used template IDs 1326, 1334, and 1333, which are set all to "2" (which means that the second template 1201 was used in the compression). Since the present embodiment uses no inverse flag, each template entity 1318, 1323, 1329 is provided with no inverse flag.

Entity connection information 1320, 1325, 1331 of each template entity 1318, 1323, 1329 contains a record of the number N(N=4, 3, or 2, respectively) of vertices constituting the consecutive sibling reference part, and the parent reference p of each template entity. For example, in the case of the template entity 1318, N=4, and p is 401. Entity information 1321, 1327, 1332 of each template entity contains information indicating vertices embraced by the template. For example, in the case of the template entity 1318, the entity information indicates four vertices as indicated by the entity connection information 1320, i.e., vertices 402, 403, 404, and 405. As described above, the cross reference data 1204 can be compressed by using the second template 1201. Since the second template 1201 used in the compression has no pattern information, the storage quantity necessary for storage of the second template 1201 can be small. For this reason, it is feasible to reduce the memory use quantity of the template storage 102.

Embodiment of Data Decompressor

Figure 12:
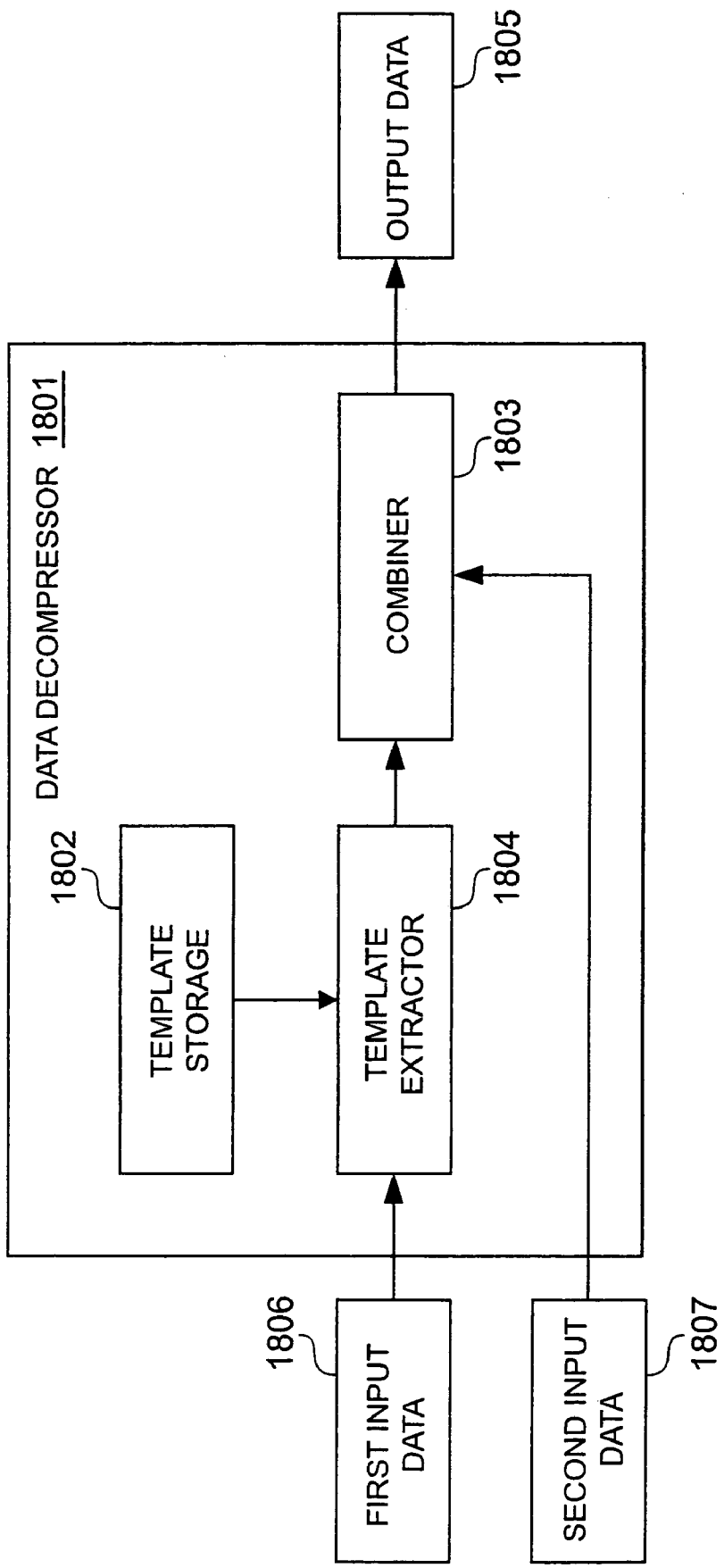
FIG. 12 is a diagram showing a configuration of a data decompressor according to an embodiment of the present invention.

Next, a data decompressor 1801 will be described with reference to FIG. 12. FIG. 12 is a block diagram showing a configuration of the data decompressor 1801 according to the present embodiment. This data decompressor 1801 restores original input data having a plurality of vertices with their respective types and values, and reference information between the vertices, from compressed cross reference data (compressed reference data) 1100 shown in FIG. 5 and data of a vertex group consisting of a plurality of vertices with their respective types and values shown in FIG. 3(b). The data decompressor 1801 has a template storage 1802, a combiner 1803, and a template extractor 1804.

FIG. 12 shows the data decompressor 1801 constructed as a single device incorporating the foregoing components, but the data decompressor 180 does not always have to be implemented as a single device and can also be implemented by connecting a plurality of devices through unrepresented communication means. For example, it is possible to adopt a configuration wherein the template storage 1802 is separated from the data decompressor 1801 and is implemented as a single separate device and wherein the two devices are connected through an unrepresented communication means. This configuration permits the template storage 1802 to be shared among a plurality of data decompressors without template storage 1802. The template extractor 1804 extracts compressed cross reference data given as first input data 1806, by using the template stored in the template storage 1802. The extraction can be carried out, for example, by the decompression procedure shown in FIG. 13. The cross reference data decompressed by the template extractor 1804 is like the cross reference data 900 shown in FIG. 3.

The combiner 1803 combines the extracted cross reference data with the data of the vertex group with types and values given as second input data shown in FIG. 3(b), and outputs combined data as output data 1805. The combining process is carried out as follows. Since the vertices are assigned their respective vertex IDs in the vertex group with types and values in the table 950 shown in FIG. 3(b), the types and values are put into the vertices of cross reference data with corresponding vertex IDs. The procedure as described above makes it feasible to restore the input data having the plurality of original vertices with their respective types and values, and the reference information between the vertices.

The decompression procedure is as follows. In FIG. 13, step 21 after a start is to define all the template entities included in the compressed cross reference data, as X1, X2, . . . , Xn, and the following processing is carried out for each of all the template entities. A selected template entity is denoted by Xi. Then the flow goes to step 22 to copy the reference information between vertices from the template used by the template entity Xi and assign IDs of the vertices described in the entity information of the template entity Xi. Then the flow goes to step 23 at which, where a vertex described in the entity connection information of the template entity Xi is one included in another template entity Xm, it is replaced with a vertex ID described in the template entity Xm.

Embodiment of Data Management System

The compression of the cross reference data by the data compressor according to the present invention can lead to some reduction of access speed to the data after the compression. For this reason, it is preferable to perform data management by a method of observing frequencies of use of data, keeping data with a high use frequency at any given time in a noncompressed state, returning even once-compressed cross reference data into a noncompressed state with increase of its use frequency, and conversely again compressing the data with decrease of its use frequency. By providing a data management system for carrying out such data management, it becomes feasible to realize both increase of speed of the entire system and saving of the memory.

Figure 14:
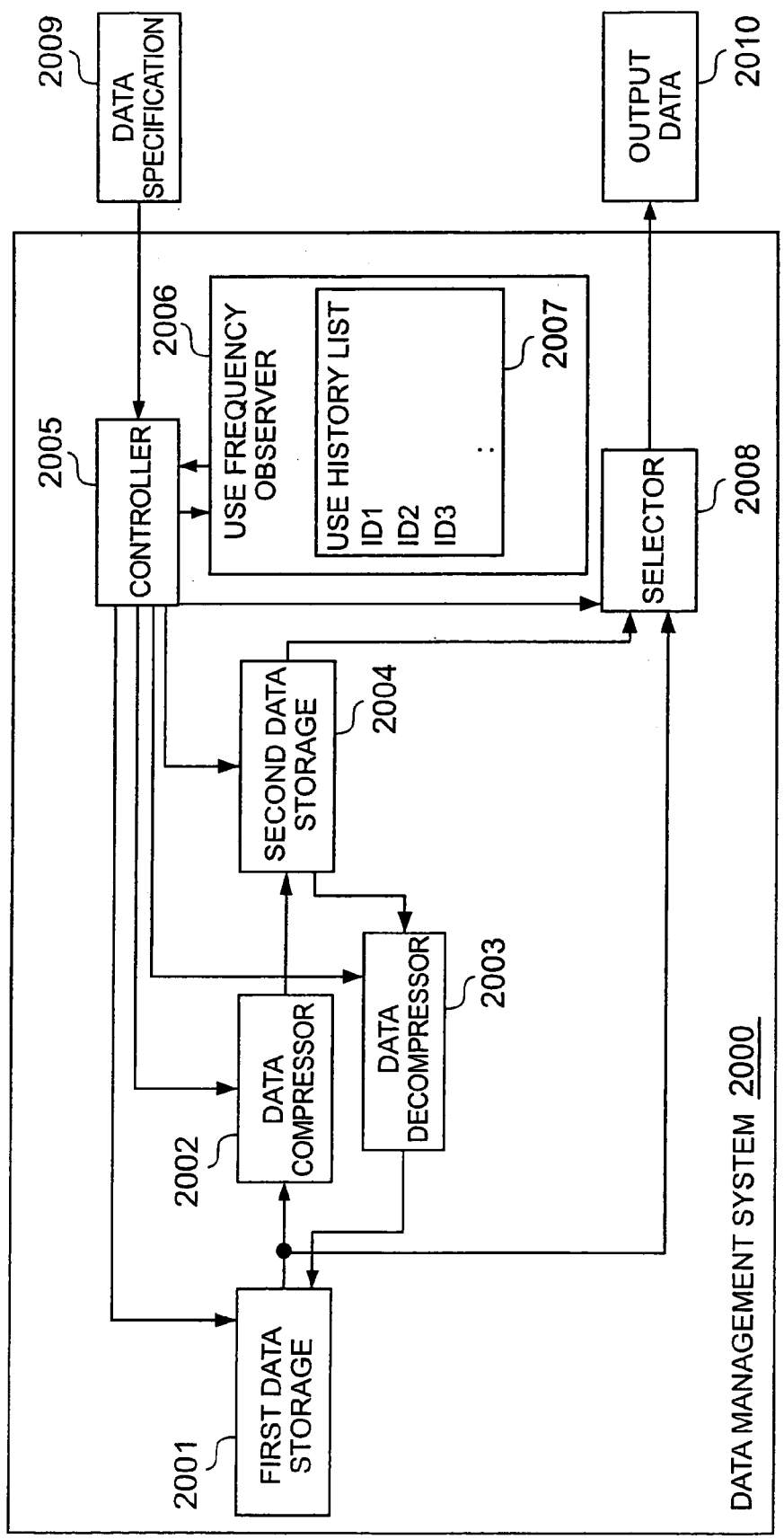
FIG. 14 is a block diagram showing a configuration of a data management system.

FIG. 14 is a block diagram showing a configuration of a data management system 2000 capable of performing such data management. The data management system 2000 has a first data storage 2001, a second data storage 2004, a data compressor 2002, and a data decompressor 2003. The data management system 2000 also has a use frequency observing device 2006, a controller 2005, and a selector 2008.

The data management system 2000 in the present embodiment is constructed as a single system incorporating the devices, but the data management system according to the present invention does not always have to be implemented as a single system, and can also be implemented by connecting the devices through unrepresented communication means. For example, it is also possible to adopt a configuration wherein the first data storage 2001 is separated from the data management system 2000, the later-described template storage 102 is removed from the data compressor 2002, the first data storage 2001 is implemented as a single separate device, and the two devices are connected through a communication means. This configuration permits a plurality of data management systems without the first data storage 2001 to share the first data storage 2001. The same also applies to the other components.

Figure 20:
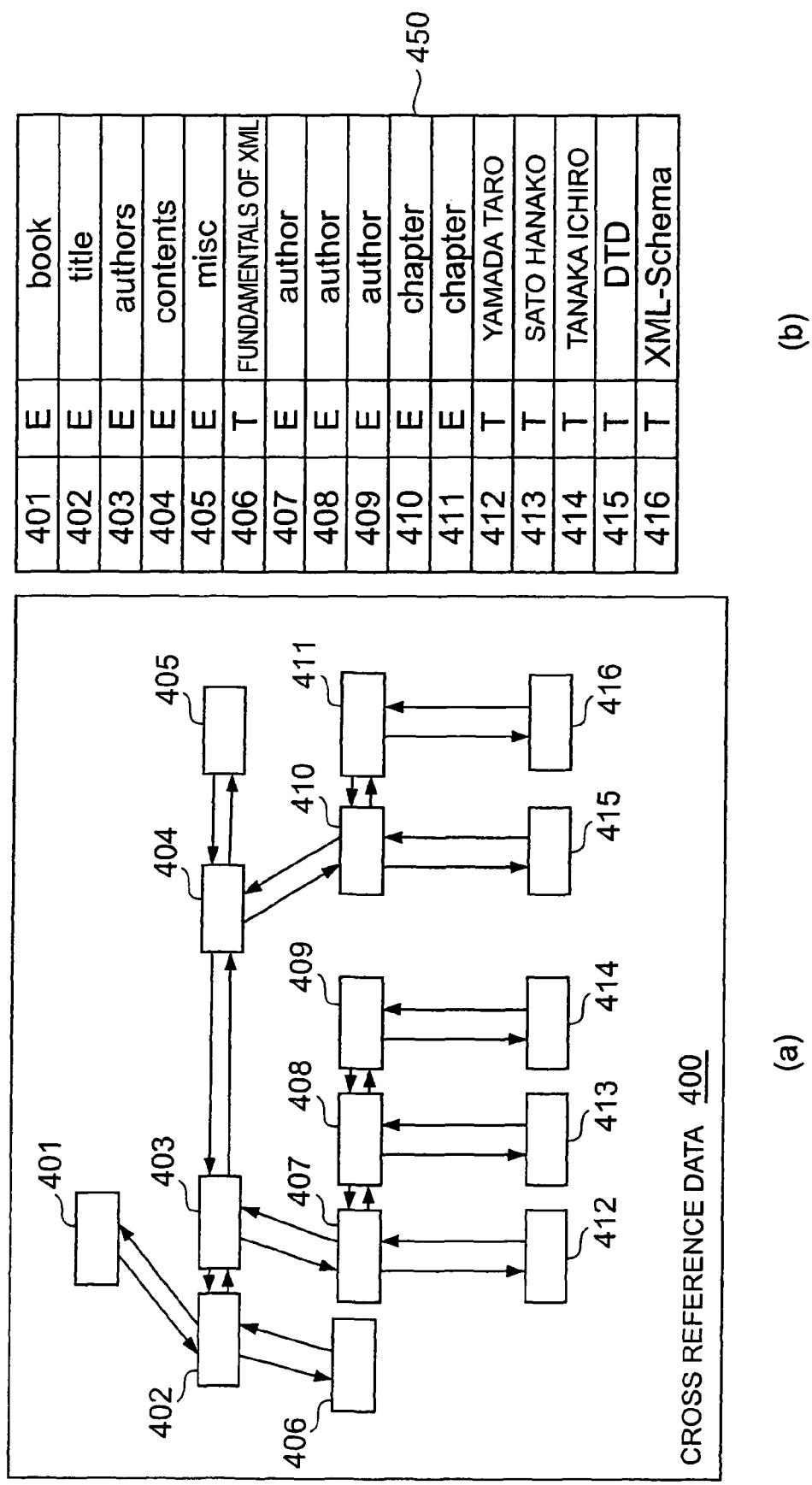
FIG. 20 is a diagram showing cross reference data and a table of an assembly of vertices separated from the XML document of FIG. 19.

The first data storage 2001 stores as compressible data, data of a format suitable for the computer, in a noncompressed state (e.g., cross reference data 400 shown in FIG. 20, or the like). The second data storage 2004 stores compressed data (e.g., the cross reference data 1100 shown in FIG. 5, or the like). Here the data compressor 2002 has the same configuration as the aforementioned data compressor 101 according to the present invention, and the data decompressor 2003 has the same configuration as the aforementioned data decompressor 1801.

The controller 2005 controls the first data storage 2001, the second data storage 2004, the data compressor 2002, the data decompressor 2003, and the selector 2008 on the basis of data specification 2009 supplied from the outside of the system. This controller 2005 performs a control for movement of data corresponding to a specification of the data specification 2009, in accordance with a movement request from the use frequency observing device 2006. The selector 2008 acquires stored data from either of the first data storage 2001 and the second data storage 2004 in accordance with an instruction from the controller 2005, and outputs the acquired data.

The use frequency observing device 2006 observes the frequency of use of data (cross reference data) stored in the first data storage 2001 or in the second data storage 2004, and outputs a later-described movement request according to the observed frequency of use. This use frequency observing device 2006 retains a use history list 2007 inside. This use history list 2007 preserves a plurality of (N) discrimination IDs of data requested to use, in the order of the use requests in the form of a linear list (not shown), for example. The data management system 2000 in the present embodiment assigns each data item a discrimination ID for uniquely discriminating the data item stored inside. The data specification 2009 is a means for supplying a discrimination ID for specific data from the outside.

The details of the actual operation will be described below. In the case of the data management system 2000, data is stored in either of the first data storage 2001 and the second data storage 2004, and in an initial state the data may be stored in any one of the first data storage 2001 and the second data storage 2004. It is assumed in the description below that all the data is stored in the second data storage 2004.

With input of a discrimination ID from the outside by the data specification 2009, the controller 2005 receives it and feeds an instruction to the use frequency observing device 2006. Receiving the instruction from the controller 2005, the use frequency observing device 2006 feeds information to notify in which of the first data storage 2001 and the second data storage 2004 the pertinent data is stored and whether the data is to be moved between the two storage devices, to the controller 2005.

Here the use frequency observing device 2006 refers to the use history list 2007, for the designation of the first data storage 2001 and the second data storage 2004, and determines whether the data designated by the data specification 2009 is present in the use history list 2007. Then the use frequency observing device 2006 gives, for example, such a reply that the data is stored in the first data storage 2001, with the data in the list or that the data is stored in the second data storage 2004, without the data in the list.

Furthermore, as to the presence/absence of data movement between the first data storage 2001 and the second data storage 2004, the use frequency observing device 2006 gives a reply to the controller 2005 as follows. For example, it makes the reply on the following assumption: data newly described (or recorded) in the use history list 2007 with an update of the use history list 2007 has moved from the second data storage 2004 to the first data storage 2001; data eliminated from the use history list 2007 with an update of the history list has moved from the first data storage 2001 to the second data storage 2004.

Then the controller 2005 controls the first data storage 2001 or the second data storage 2004, based on the above-described reply from the use frequency observing device 2006, to make it output the stored data, and makes the selector 2008 output the data obtained from either of them to the outside of the data management system 2000.

When the controller 2005 receives a request for movement of data from the use frequency observing device 2006, it performs a control for movement of the data between the data storages 2001, 2004. For example, where the controller 2005 receives a movement request for movement of data from the first data storage 2001 to the second data storage 2004, it performs, because of its low frequency of use, such a control for movement of the data as to extract the data from the first data storage 2001, compress the data by the data compressor 2002, and then store the compressed data in the second data storage 2004. Then the controller 2005 performs a control to delete the extracted data from the first data storage 2001.

Conversely, when the controller receives a movement request for movement of data from the second data storage 2004 to the first data storage 2001, it performs, because of its high frequency of use, such a control as to extract the data from the second data storage 2004, decompress the compressed data by the data decompressor 2003, and store the decompressed data in the first data storage 2001. The controller 2005 also performs such a control as to delete the extracted data from the second data storage 2004.

In the data management system 2000, as described above, the controller 2005 controls the movement of data in accordance with the movement request from the use frequency observing device 2006, whereby the data can be moved between the first data storage 2001 and the second data storage 2004. Therefore, the cross reference data can be stored as appropriately switched between the compressed state and the noncompressed state in accordance with its frequency of use. Then data with a high frequency of use is stored in the noncompressed state, so as to maintain its use speed high, whereby the memory use quantity of the entire system can be reduced while maintaining the operation speed high.

Other Embodiment

Figure 15:
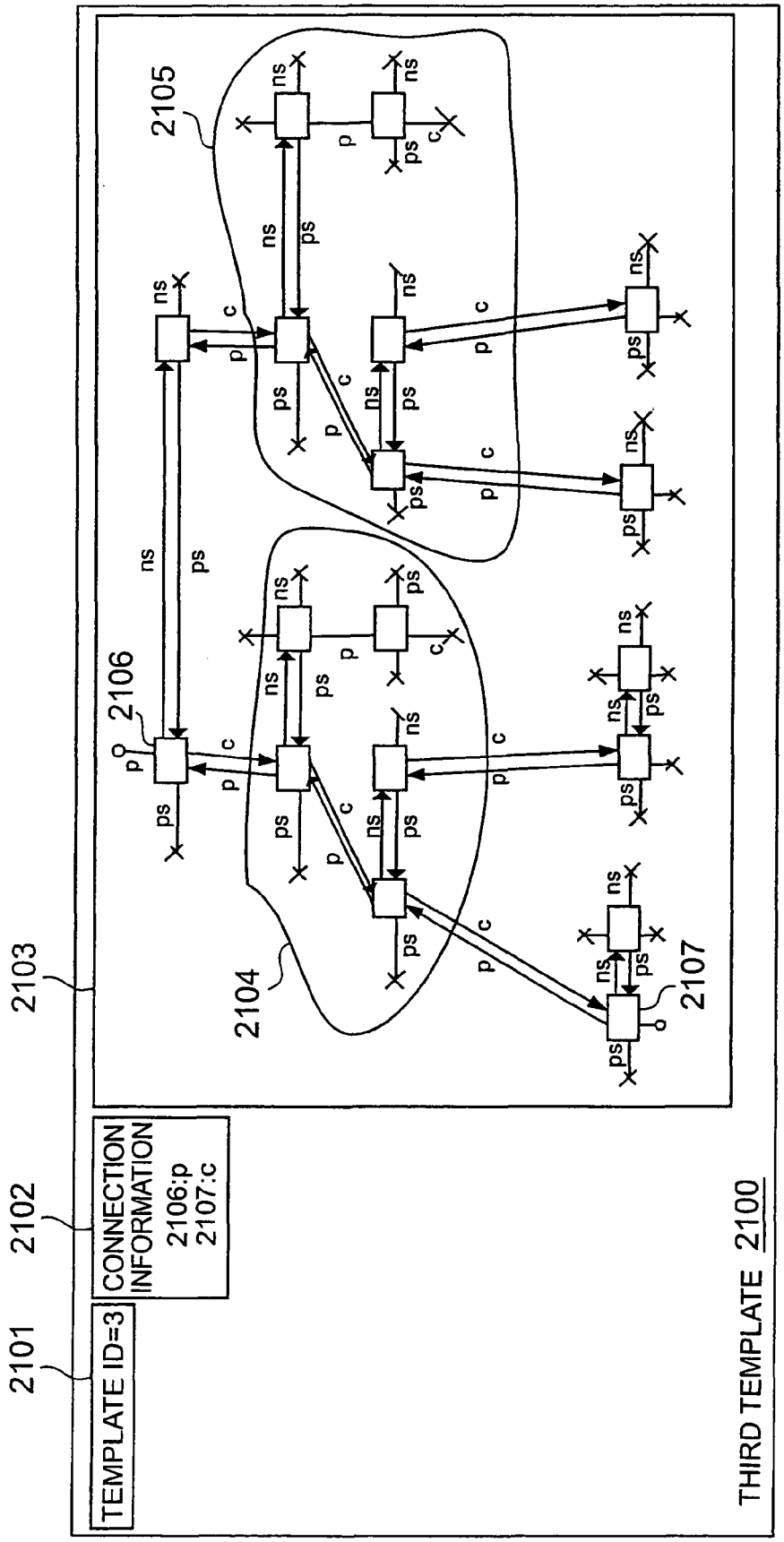
FIG. 15 is a block diagram showing a configuration of a third template.

According to the present invention, the template storage can also store a template as shown in FIG. 15. FIG. 15 is a diagram showing a third template 2100. It is seen that the reference information between vertices in areas 2104 and 2105 in the pattern information 2103 of the third template 2100 shown in FIG. 15 matches the pattern information of the first template 1011 shown in FIG. 4(*c*). Therefore, the templates described heretofore can also be applied to the pattern information inside the template, by extending the templates and template entities and adding information describing the number of templates applied to the interior, an ID capable of uniquely discriminating each template inside the template, and so on.

For the sake of description herein, where the aforementioned template is applied to the pattern information inside a template, the original template will be referred to as a parent template, and a template applied to the pattern information inside the template, as a child template. FIGS. 17(*a*) and (*b*) show configuration examples of parent template 2300 and parent template entity 2320, respectively, for enabling the application of the template to the pattern information inside the template as well. The parent template 2300 and the parent template entity 2320 are different from the template 1003 and the template entity 1020 used in the first embodiment shown in FIG. 4, in that the parent template 2300 contains additional, interior template information 2301 and in that the parent template entity 2320 contains additional, interior template entity connection information 2302 and interior template entity information 2303.

The interior template information 2301 contains, for example, the number of child templates and IDs of the child templates. The interior template entity information 2303 contains a description of a correspondence relation for each vertex, to specify the correspondence between the vertices embraced in a child template and the vertices before the application of the parent template, in the actual application of the parent template. The interior template entity connection information 2302 contains a description of connection information in connection of a child template to the exterior parent template, in the actual application of the parent template.

Figure 16:
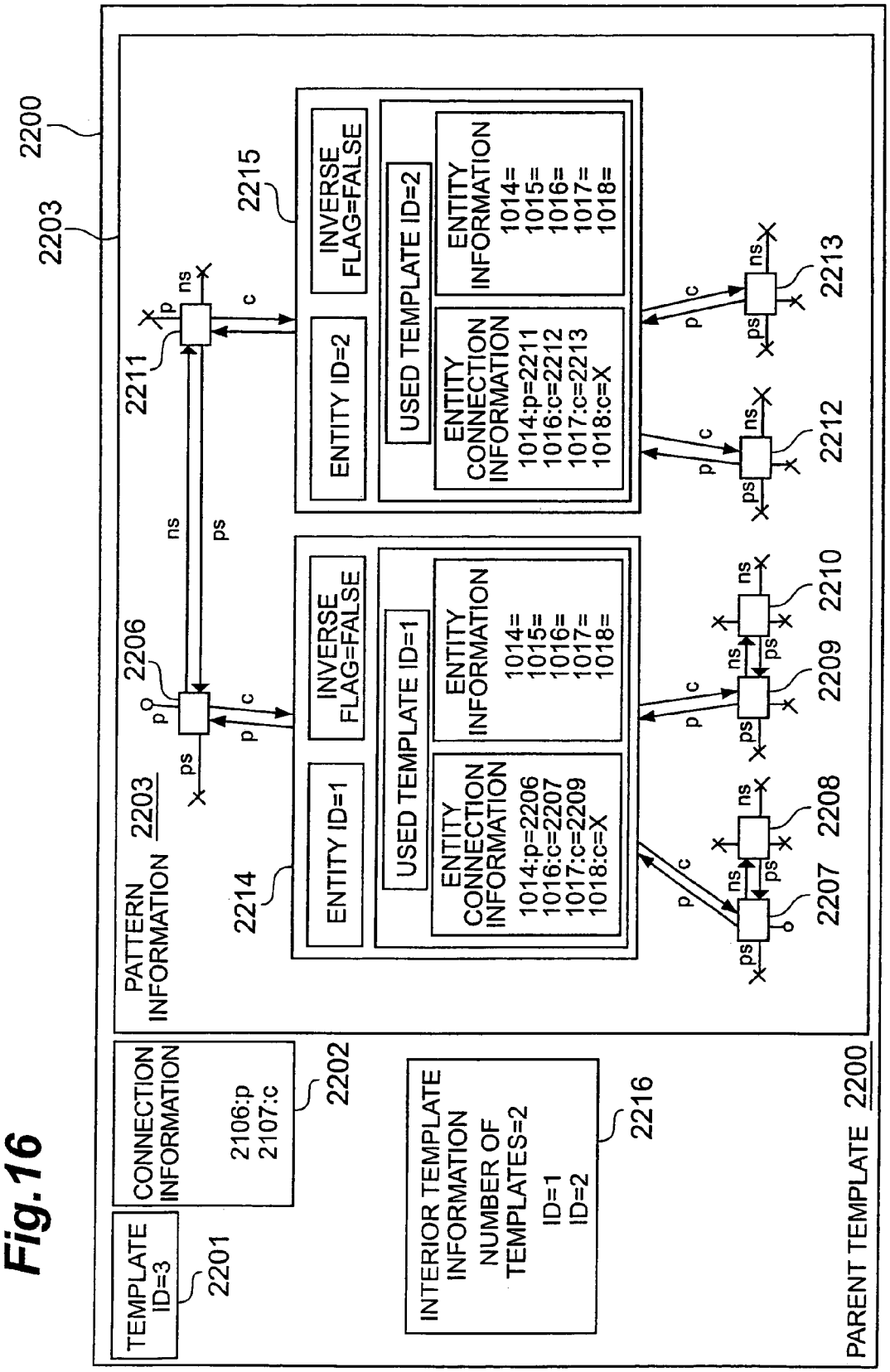
FIG. 16 is a block diagram showing an example of a parent template having templates inside.
Figure 19:
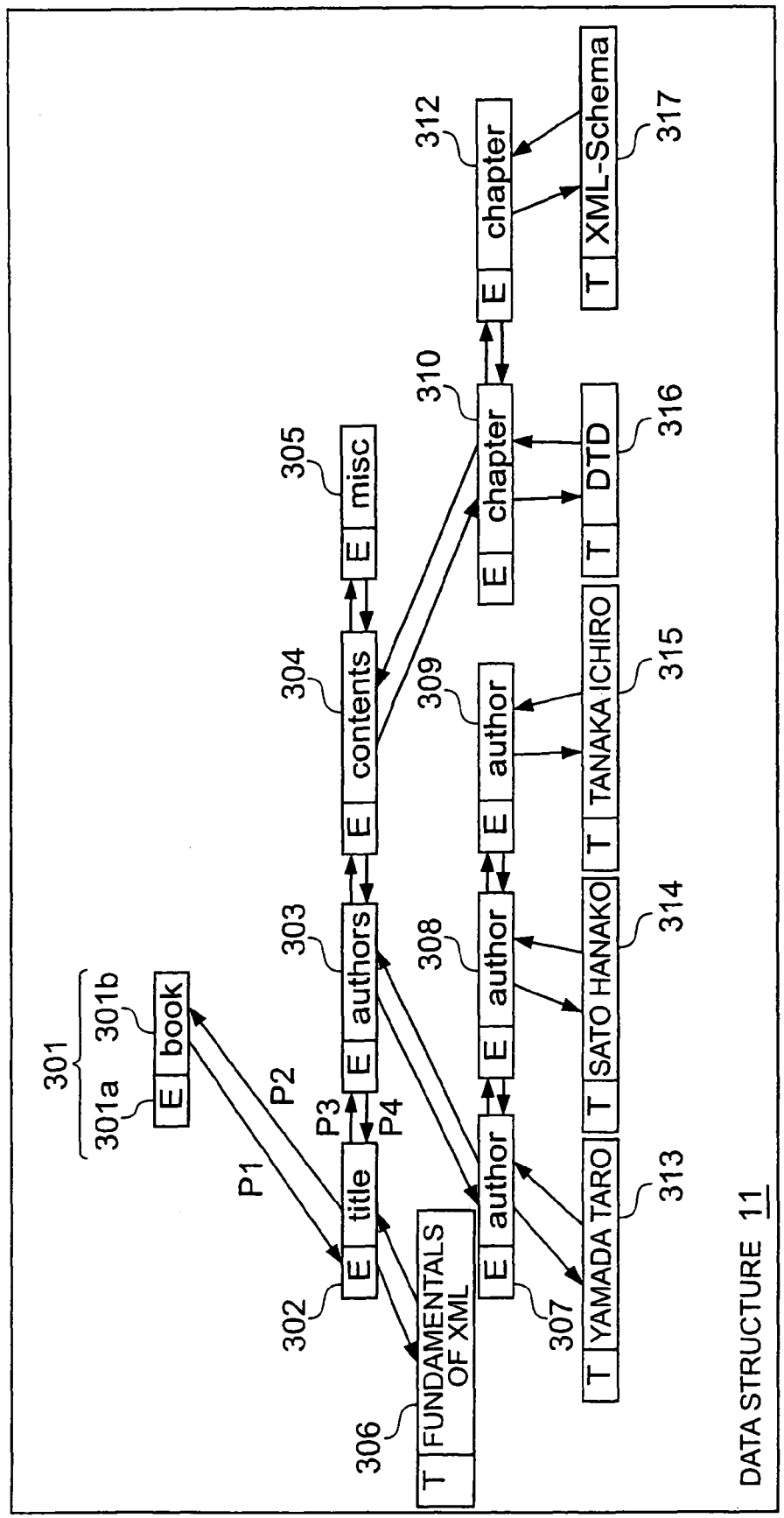
FIG. 19 is a diagram showing a data structure of the XML document of FIG. 18.

FIG. 16 shows a specific parent template 2200 of the template shown in FIG. 17(*a*). In this parent template 2200, the interior template information 2216 contains ID=1 and ID=2 because two types of child templates are applied to two portions. The pattern information 2203 is compressed according to the procedure of compressing the cross reference data as in the first embodiment, and the first template 1011 is applied thereto.

When the parent template 2200 of this configuration is applied to the cross reference data, a template can be defined by using a definition of another template, and it is thus feasible to reduce the information volume of the template, as compared with the third template 2100 as shown in FIG. 15.

The disclosure of Japanese Patent Application No. 2003-328428 filed Sep. 19, 2003 including specification, drawings and claims is incorporated herein by reference in its entirety.

What is claimed is:

1. A data compressor, comprising:
separating means for separating input data including a plurality of vertices defining respective data types and data values, and reference information hierarchically positioning the plurality of vertices with respect to each other, into (1) cross reference data including the reference information hierarchically positioning the plurality of vertices with respect to each other, and (2) a vertex group including the plurality of vertices defining the respective data types and data values, and for outputting data of the vertex group thus separated, as a first component of compressed data;
template storing means for storing a template defining reference information corresponding to a specific pattern of vertices therein;
template match detecting means for detecting a portion of the cross reference data that matches the template stored in the template storing means; and
template replacing means for replacing the matched portion of the cross reference data with a template entity, the template entity defining a correspondence between the vertices of the template and the plurality of vertices within the matched portion and defining the plurality of vertices outside the matched portion to which the vertices of the template are connected, and for outputting the cross reference data replaced with the template entity as a second component of the compressed data, wherein
when one of the plurality of vertices outside the matched portion is included in another template entity, the one of the plurality of vertices outside the matched portion is defined in the template entity by referring to a vertex of another template applied in the another template entity, and
the compressed data includes a used template ID and entity connection information that define the data structure of the input data such that the data structure of the input data is restored when the compressed data is decompressed by a data decompressor.

2. The data compressor according to claim 1, wherein the template match detecting means detects the portion of the cross reference data that matches the template in which directions of sibling relations of the template are inverted in part or all of the reference information between the specific pattern of vertices, and
the compressed data includes an inversion identifier indicating whether the directions of the sibling relations of the template are used in an inverted state in the compression of the cross reference data.

3. The data compressor according to claim 1, wherein the template storing means stores a parent template in which the template is applied to the reference information corresponding to vertices of the parent template.

4. The data compressor according to claim 1, wherein the template storing means stores a common template that is used in common to a plurality of said input data.

5. A data compressor, comprising:
separating means for separating input data including a plurality of vertices defining respective data values, each data value including a data type as attribute information, and reference information hierarchically positioning the plurality of vertices with respect to each other, into (1) cross reference data including the reference information hierarchically positioning the plurality of vertices with respect to each other, and (2) a vertex group including the plurality of vertices defining the respective values, and for outputting data of the vertex group thus separated, as a first component of compressed data;
template storing means for storing a template defining reference information corresponding to a specific pattern of vertices therein;
template match detecting means for detecting a portion of the cross reference data that matches the template stored in the template storing means; and
template replacing means for replacing the matched portion of the cross reference data with a template entity, the template entity defining a correspondence between the vertices of the template and the plurality of vertices within the matched portion and defining the plurality of vertices outside the matched portion to which the vertices of the template are connected, and for outputting the cross reference data replaced with the template entity as a second component of the compressed data, wherein
when one of the plurality of vertices outside the matched portion is included in another template entity, the one of the plurality of vertices outside the matched portion is defined in the template entity by referring to a vertex of another template applied in the another template entity, and
the compressed data includes a used template ID and entity connection information that define the data structure of the input data such that the data structure of the input data is restored when the compressed data is decompressed by a data decompressor.

6. The data compressor according to claim 5, wherein the template match detecting means detects the portion of the cross reference data that matches the template in which directions of sibling relations of the template are inverted in part or all of the reference information between the specific pattern of vertices, and
the compressed data includes an inversion identifier indicating whether the directions of the sibling relations of the template are used in an inverted state in the compression of the cross reference data.

7. The data compressor according to claim 5, wherein the template storing means stores a parent template in which the template is applied to the reference information corresponding to vertices of the parent template.

8. The data compressor according to claim 5, wherein the template storing means stores a common template that is used in common to a plurality of said input data.

9. A data compressor, comprising:
a separating unit configured to separate input data including a plurality of vertices defining respective data types and data values, and reference information hierarchically positioning the plurality of vertices with respect to each other, into (1) cross reference data including the reference information hierarchically positioning the plurality of vertices with respect to each other, and (2) a vertex group including the plurality of vertices defining the respective data types and data values, and to output data of the vertex group thus separated, as a first component of compressed data;
a template storing unit configured to store a template defining reference information corresponding to a specific pattern of vertices therein;
a template match detecting unit configured to detect a portion of the cross reference data that matches the template stored in the template storing unit; and a template replacing unit configured to replace the matched portion of the cross reference data with a template entity, the template entity defining a correspondence between the vertices of the template and the plurality of vertices within the matched portion and defining the plurality of vertices outside the matched portion to which the vertices of the template are connected, and to output the cross reference data replaced with the template entity as a second component of the compressed data, wherein when one of the plurality of vertices outside the matched portion is included in another template entity, the one of the plurality of vertices outside the matched portion is defined in the template entity by referring to a vertex of another template applied in the another template entity, and the compressed data includes a used template ID and entity connection information that define the data structure of the input data such that the data structure of the input data is restored when the compressed data is decompressed by a data decompressor.

10. A data compressor, comprising:

a separating unit configured to separate input data including a plurality of vertices defining respective data values, each data value including a data type as attribute information, and reference information hierarchically positioning the plurality of vertices with respect to each other, into (1) cross reference data including the reference information hierarchically positioning the plurality of vertices with respect to each other, and (2) a vertex group including the plurality of vertices defining the respective data values, and to output data of the vertex group thus separated, as a first component of compressed data;

a template storing unit configured to store a template defining reference information corresponding to a specific pattern of vertices therein;

a template match detecting unit configured to detect a portion of the cross reference data that matches the template stored in the template storing unit; and a template replacing unit configured to replace the matched portion of the cross reference data with a template entity, the template entity defining a correspondence between the vertices of the template and the plurality of vertices within the matched portion and defining the plurality of vertices outside the matched portion to which the vertices of the template are connected, and to output the cross reference data replaced with the template entity as a second component of the compressed data, wherein when one of the plurality of vertices outside the matched portion is included in another template entity, the one of the plurality of vertices outside the matched portion is defined in the template entity by referring to a vertex of another template applied in the another template entity, and the compressed data includes a used template ID and entity connection information that define the data structure of the input data such that the data structure of the input data is restored when the compressed data is decompressed by a data decompressor.

11. The data compressor according to claim 1, wherein the template match detecting means detects the portion of the cross reference data that matches the template, the template including a template ID that uniquely identifies the template, connection information that includes a list of connection references to the plurality of vertices outside the template, and pattern information that represents a pattern of reference information between the vertices of the template, and the template replacing means replaces the matched portion of the cross reference data with the template entity including a used template ID that identifies the template applied.

12. The data compressor according to claim 5, wherein the template match detecting means detects the portion of the cross reference data that matches the template, the template including a template ID that uniquely identifies the template, connection information that includes a list of connection references to the plurality of vertices outside the template, and pattern information that represents a pattern of reference information between the vertices of the template, and the template replacing means replaces the matched portion of the cross reference data with the template entity including a used template ID that identifies the template applied.

13. The data compressor according to claim 9, wherein the template match detecting unit is configured to detect the portion of the cross reference data that matches the template, the template including a template ID that uniquely identifies the template, connection information that includes a list of connection references to the plurality of vertices outside the template, and pattern information that represents a pattern of reference information between the vertices of the template, and the template replacing unit is configured to replace the matched portion of the cross reference data with the template entity including a used template ID that identifies the template applied.

14. The data compressor according to claim 10, wherein the template match detecting unit is configured to detect the portion of the cross reference data that matches the template, the template including a template ID that uniquely identifies the template, connection information that includes a list of connection references to the plurality of vertices outside the template, and pattern information that represents a pattern of reference information between the vertices of the template, and the template replacing unit is configured to replace the matched portion of the cross reference data with the template entity including a used template ID that identifies the template applied.

15. The data compressor according to claim 9, wherein the template match detecting unit is configured to detect the portion of the cross reference data that matches the template in which directions of sibling relations of the template are inverted in part or all of the reference information between the specific pattern of vertices, and the compressed data includes an inversion identifier indicating whether the directions of the sibling relations of the template are used in an inverted state in the compression of the cross reference data.

16. The data compressor according to claim 10, wherein the template match detecting unit is configured to detect the portion of the cross reference data that matches the template in which directions of sibling relations of the template are inverted in part or all of the reference information between the specific pattern of vertices, and the compressed data includes an inversion identifier indicating whether the directions of the sibling relations of the template are used in an inverted state in the compression of the cross reference data.

* * * * *